(12) United States Patent
Burns et al.

(10) Patent No.: US 8,573,259 B2
(45) Date of Patent: Nov. 5, 2013

(54) MODULAR MICROFLUIDIC ASSEMBLY BLOCK AND SYSTEM INCLUDING THE SAME

(75) Inventors: Mark A. Burns, Ann Arbor, MI (US); Minsoung Rhee, Chelsea, MA (US); Sean M. Langelier, Ann Arbor, MI (US); Brian N. Johnson, Ypsilanti, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 696 days.

(21) Appl. No.: 12/731,964

(22) Filed: Mar. 25, 2010

(65) Prior Publication Data
US 2010/0258211 A1 Oct. 14, 2010

Related U.S. Application Data

(60) Provisional application No. 61/210,983, filed on Mar. 25, 2009.

(51) Int. Cl.
*F15C 1/06* (2006.01)

(52) U.S. Cl.
USPC ........... 137/833; 137/270; 137/271; 137/884; 422/503

(58) Field of Classification Search
USPC ............. 137/833, 884, 269, 270, 271, 561 R; 422/502–508
See application file for complete search history.

(56) References Cited

U.S. PATENT DOCUMENTS

| | | | |
|---|---|---|---|
| 3,548,849 A | 12/1970 | Purcell | |
| 3,934,605 A * | 1/1976 | Legris | 137/271 |
| 5,580,523 A | 12/1996 | Bard | |
| 6,086,740 A | 7/2000 | Kennedy | |
| 6,581,640 B1 * | 6/2003 | Barron | 137/833 |
| 6,688,325 B2 * | 2/2004 | Hettinger | 137/270 |
| 6,929,030 B2 | 8/2005 | Unger et al. | |
| 7,011,793 B2 | 3/2006 | Zhou et al. | |
| 7,146,999 B2 * | 12/2006 | Giese et al. | 137/269 |
| 7,419,639 B2 | 9/2008 | Osterfeld et al. | |
| 7,601,286 B2 | 10/2009 | Benett et al. | |
| 7,726,331 B1 * | 6/2010 | Giese | 137/269 |
| 2002/0020445 A1 * | 2/2002 | Hettinger | 137/270 |

(Continued)

OTHER PUBLICATIONS

Ahn et al., "Disposable Smart Lab on a Chip for Point-of-Care Clinical Diagnostics", Proceedings of the IEEE, vol. 92, No. 1, Jan. 2004, pp. 154-173.

(Continued)

*Primary Examiner* — Craig Schneider
(74) *Attorney, Agent, or Firm* — Howard & Howard Attorneys PLLC

(57) ABSTRACT

A modular microfluidic system comprising a base substrate, a plurality of microfluidic assembly blocks, and an adhesive component is provided. Each individual microfluidic assembly block defines a channel and has a sidewall defining an aperture into the channel. When the plurality of microfluidic assembly blocks are arranged on the base substrate, the aperture into the channel of one microfluidic assembly block aligns with the aperture of another microfluidic assembly block with the channels thereof connected along a plane parallel to the base substrate thereby forming a channel network defined by the plurality of microfluidic assembly blocks. The subject invention also provides a method of assembling a microfluidic device. The method comprising the steps of providing the base substrate, providing the plurality of microfluidic assembly blocks, and arranging the plurality of microfluidic assembly blocks on the base substrate.

15 Claims, 15 Drawing Sheets

(56) References Cited

U.S. PATENT DOCUMENTS

| | | | |
|---|---|---|---|
| 2002/0124896 A1 | 9/2002 | O'Connor et al. | |
| 2003/0012697 A1 | 1/2003 | Hahn et al. | |
| 2004/0228734 A1 | 11/2004 | Jeon et al. | |
| 2005/0079540 A1* | 4/2005 | Bernard | 435/7.1 |
| 2006/0065361 A1 | 3/2006 | Stiene et al. | |
| 2007/0048192 A1 | 3/2007 | Kartalov et al. | |
| 2008/0123174 A1 | 5/2008 | Wen et al. | |
| 2008/0124663 A1 | 5/2008 | Anderson et al. | |
| 2009/0056861 A1 | 3/2009 | Young et al. | |
| 2009/0257920 A1* | 10/2009 | Facer et al. | 422/99 |

OTHER PUBLICATIONS

Ali et al., "Cells on Chips", Nature, vol. 442, Jul. 27, 2006, pp. 403-411.

Anderson et al., "Fabrication of Topologically Complex Three-Dimensional Microfluidic Systems in PDMS by Rapid Prototyping", Analytical Chemistry, vol. 72, No. 14, Jul. 15, 2000, pp. 3158-3164.

Burns et al., "An Integrated Nanoliter DNA Analysis Device", Science, vol. 282, Oct. 16, 1998, pp. 484-487.

Burns, "Everyone's a (Future) Chemist", Science, vol. 296, Jun. 7, 2002, pp. 1818-1819.

Chang et al., "Poly(dimethylsiloxane) (PDMS) and Silicon Hybrid Biochip for Bacterial Culture", Biomedical Microdevices, vol. 5:4, 2003, pp. 281-290.

Duffy, "Rapid Prototyping of Microfluidic Systems in Poly(dimethylsiloxane)", Analytical Chemistry, vol. 70, No. 23, Dec. 1, 1998, pp. 4974-4984.

Grimes et al., "Shrinky-Dink microfluidics: rapid generation of deep and rounded patterns", Lab Chip, vol. 8, 2008, pp. 170-172.

Grodzinski, "A Modular Microfluidic System for Cell Pre-concentration and Genetic Sample Preparation", Biomedical Microdevices, 5:4, 2003, pp. 303-310.

Jo et al., "Three Dimensional Micro-Channel Fabrication in Polydimethylsiloxane (PDMS) Elastomer", Journal of Microelectromechanical Systems, vol. 9, No. 1, Mar. 2000, pp. 76-81.

Ju et al. "Soft material-based microculture system having air permeable cover sheet for the protoplast culture of *Nicotiana tabacum*", Bioprocess Biosyst Eng., vol. 29, 2006, pp. 163-168.

Li et al., "Parallel mixing of photolithographically defined nanoliter volumes using elastomeric microvalve arrays", Electrophoresis, vol. 26, 2005, pp. 3758-3764.

Liu et al., "Rapid method for design and fabrication of passive micromixers in microfluidic devices using a direct-printing process", Lab Chip, vol. 5, 2005, p. 974-978.

McDonald et al., "Prototyping of Microfluidic Devices in Poly(dimethylsiloxane) Using Solid-Object Printing", Analytical Chemistry, vol. 74, No. 7, Apr. 1, 2002, pp. 1537-1545.

Meldrum et al., "Microscale Bioanalytical Systems", Science, vol. 297, Aug. 16, 2002, pp. 1197-1198.

Pal et al., "An integrated microfluidic device for influenza and other genetic analyses", Lab Chip, vol. 5, 2005, pp. 1024-1032.

Rhee et al., "Drop Mixing in a Microchannel for Lab-on-a-Chip Platforms", Langmuir, vol. 24, 2008, pp. 590-601.

Shaikh et al., "A modular microfluidic architecture for integrated biochemical analysis", PNAS, vol. 102, No. 28, pp. 9745-9750.

Tan et al., "Rapid fabrication of microfluidic devices in poly(dimethylsiloxane) by photocopying", Lab on a Chip, vol. 1, 2001, pp. 7-9.

Whitesides, "The origins and the future of microfluidics", Nature, vol. 442, Jul. 27, 2006, pp. 368-373.

Xia et al., "Soft Lithography", Ann. Rev. Mater. Sci, vol. 28, 1998, pp. 153-184.

\* cited by examiner

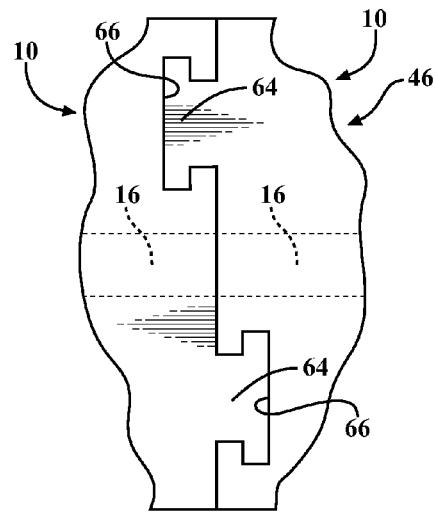
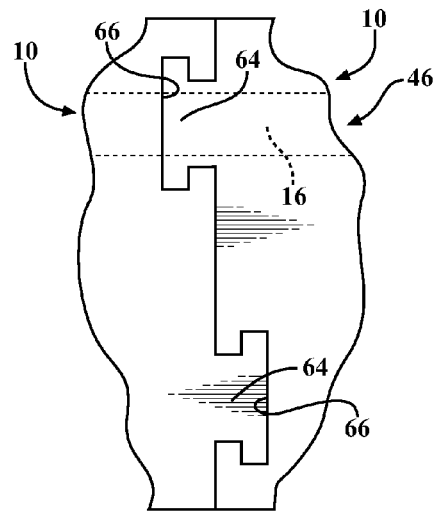
FIG. 3A  FIG. 3B
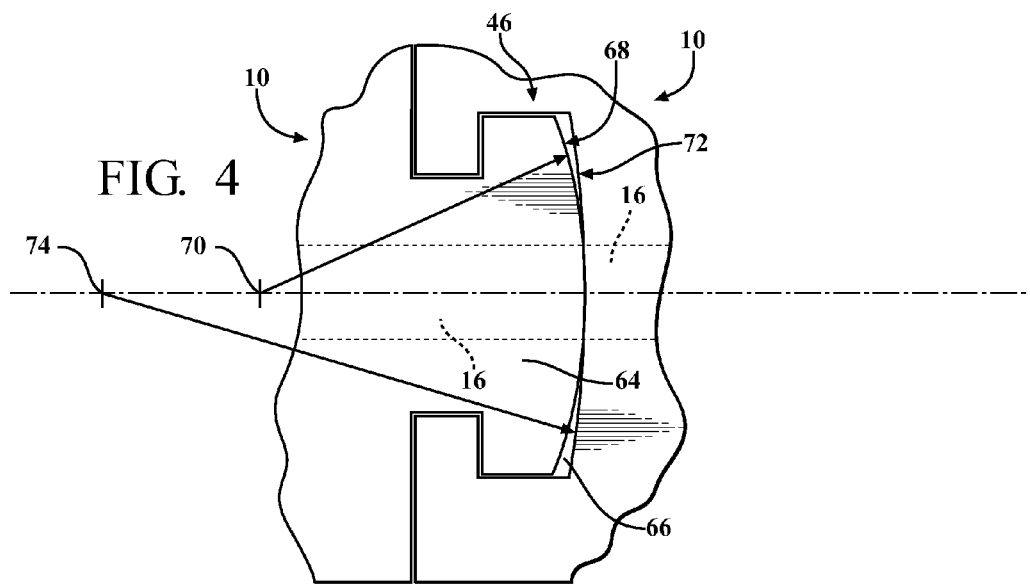
FIG. 4

MODULAR MICROFLUIDIC ASSEMBLY BLOCK AND SYSTEM INCLUDING THE SAME

CROSS-REFERENCE TO RELATED APPLICATIONS

This application claims priority to and all the advantages of U.S. Provisional Patent Application No. 61/210,983, filed on Mar. 25, 2009.

GOVERNMENT LICENSING RIGHTS

This invention was made with government support under grant numbers 5-P01-HG001984, R01-AI049541, and R01-GM-37006-17 awarded by the National Institute of Health. The government has certain rights in the invention.

BACKGROUND OF THE INVENTION

1. Field of the Invention

The instant invention generally relates to a microfluidic assembly block, a modular microfluidic system, and a method of assembling a microfluidic device. More specifically, the instant invention relates to a modular microfluidic system including a base substrate, a plurality of the microfluidic assembly blocks, an adhesive component, and a method of forming a microfluidic device by arranging the microfluidic assembly blocks on the base substrate.

2. Description of the Related Art

Microfluidic devices are useful for performing a wide array of chemical and biological functions. For example, microfluidic devices have been used to perform functions such as liquid phase separations, mixing operations, cell culture growth, polymerase chain reactions, restriction enzyme digest reactions, and other chemical reactions. Microfluidic devices have even been used to perform complex biochemical assays. Benefits of microfluidic devices include a reduction in the use of expensive reagents, shorter reaction and analysis times, and portability. Despite such benefits, the potential of microfluidic devices has not been fully realized. For microfluidic devices, a knowledge gap still exists between microfluidic device technology and potential users, such as those who are skilled in the life sciences. Further, potential users are unlikely to possess the equipment necessary to produce there own custom microfluidic devices.

Collaboration between developers of the microfluidic device technology and microfluidic device users has advanced design and fabrication of microfluidic devices. In addition, private entities, such as corporations, as well as public entities, such as universities, have advanced microfluidic device technology through manufacturing and marketing of microfluidic devices. However, microfluidic devices remain expensive to design and fabricate due to substantial development costs, lack of effective prototyping techniques, low volume production, and limited functionality.

Due to the microscopic nature of microfluidic devices and the desire to minimize fluid leakage in microfluidic devices, assembly of microfluidic devices is also a difficult task. Consequently, numerous microfluidic devices must often be fabricated to produce one microfluidic device that adequately performs. Furthermore, once microfluidic devices are fabricated, modifications to improve the effectiveness of the microfluidic devices are difficult, if not impossible, to make and use of a given microfluidic device is limited to its original purpose.

During operation, microfluidic devices typically perform a series of operations in sequence or in parallel. The operations are performed in a network of channels having a specific configuration. For example, a complex biochemical assay can be performed in a microfluidic device in which mixing, polymerase chain reaction, restriction enzyme digest reaction, and separation operations are performed in sequence. In this example, the mixing operation occurs via chaotic advection in a channel having a zigzag configuration 32, the polymerase chain reaction and restriction enzyme digest reaction occur in a channel having a chamber configuration 42, and the separation operation occurs in a channel having a separation configuration. Should the microfluidic devices fail to function properly, it is difficult to determine which operation is the root cause of the failure, i.e., which channels are not working, because individual channels within the network cannot be tested. Because the entire network of channels must be tested as a whole, it is also difficult to make modifications to improve efficiency of microfluidic devices. Further, should potential users decide to use the microfluidic devices for different purposes or change the sequence of operations to be performed, new microfluidic devices must be designed and fabricated.

Because of the above-mentioned issues associated with the design, fabrication, and assembly of microfluidic devices and because existing microfabrication techniques do no allow for the rapid development of prototype microfluidic devices, potential users are deterred from designing, fabricating, and using microfluidic devices. In view of the challenges outlined above, there remains a need to develop efficient and economical microfluidic systems which address one or more of the challenges.

SUMMARY OF THE INVENTION AND ADVANTAGES

The subject invention provides a microfluidic assembly block, a modular microfluidic system, and a method of assembling a microfluidic device. The modular microfluidic system comprises a base substrate, a plurality of the microfluidic assembly blocks, and an adhesive component for bonding the plurality of microfluidic assembly blocks to one another and to the base substrate. Each individual microfluidic assembly block defines a channel and has a sidewall defining an aperture into the channel. When the plurality of microfluidic assembly blocks are arranged on the base substrate, the aperture into the channel of one microfluidic assembly block aligns with the aperture of another microfluidic assembly block with the channels thereof connected along a plane parallel to the base substrate, thereby forming a channel network defined by the plurality of microfluidic assembly blocks.

The method comprises the steps of providing the base substrate, providing the plurality of microfluidic assembly blocks, and arranging the plurality of microfluidic assembly blocks on the base substrate.

The modular microfluidic system provided herein presents many advantages. Microfluidic assembly blocks can be fabricated in advance and potential users can assemble the blocks having different channel configurations to form the microfluidic device desired. The modular microfluidic system also allows for rapid prototyping. Under some circumstances, the microfluidic assembly blocks can be reconfigured to improve the microfluidic device or to configure the microfluidic device for a new use. In sum, the advantages presented by the modular microfluidic system reduce the cost, time, and complexity of designing and fabricating microfluidic devices such that potential users can readily fabricate microfluidic devices and reap the benefits of such devices.

BRIEF DESCRIPTION OF THE DRAWINGS

FIG. 3A is a partial schematic top view of one embodiment of a first and a second MAB comprising an interlocking mechanism operatively connecting the microfluidic assembly blocks to each other. The interlocking mechanism comprises a tab extending from a sidewall of one microfluidic assembly block and a recess defined by a sidewall of another microfluidic assembly block.

FIG. 3B is a partial schematic top view of another embodiment of a first and a second MAB comprising an interlocking mechanism operatively connecting the microfluidic assembly blocks to each other. The interlocking mechanism comprises a tab extending from a sidewall of one microfluidic assembly block and a recess defined by a sidewall of another microfluidic assembly block. In contrast to FIG. 3A, a channel is further defined by the tab.

FIG. 4 is a partial schematic top view of yet another embodiment of a first and a second MAB comprising an interlocking mechanism operatively connecting the microfluidic assembly blocks to each other. The interlocking mechanism comprises a tab extending from a sidewall of one microfluidic assembly block and a recess defined by a sidewall of another microfluidic assembly block. A channel is further defined by the tab. The tab has a convex surface having a radius and defines the aperture formed by the channel, and the recess defines a convex surface having a radius and with an aperture defined therein. The radius of the convex surface is smaller than the radius of the concave surface such that when the microfluidic assembly blocks are interlocked, the convex surface and the concave surface create mechanical stress between the tab and the recess thereby sealing the channels.

DETAILED DESCRIPTION OF THE INVENTION

The instant invention generally relates to a microfluidic assembly block 10, a modular microfluidic system, and a method of assembling a microfluidic device 12. More specifically, the instant invention relates to a modular microfluidic system including a base substrate 14, a plurality of the microfluidic assembly blocks 10, and an adhesive component, and a method of forming a microfluidic device 12 by arranging the microfluidic assembly blocks 10 on the base substrate 14. The microfluidic device 12 may be used in various chemical and biological applications such as for preparing biological assays as described in further detail below.

Figure 1A:
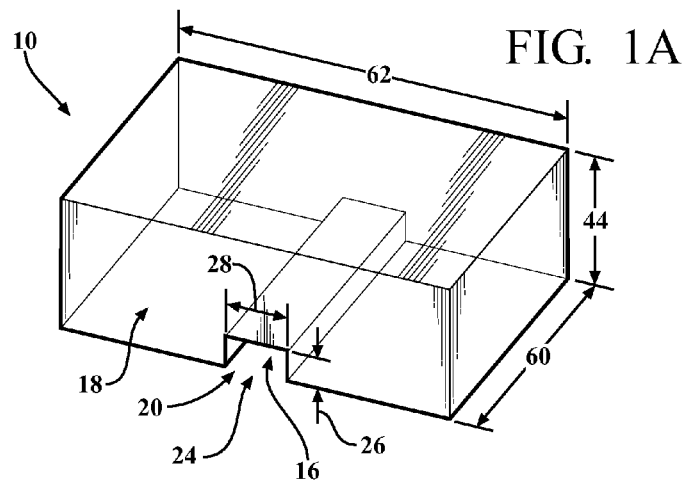
FIG. 1A is a schematic perspective view of a microfluidic assembly block (MAB) defining a channel and having a sidewall defining an aperture into the channel with the channel defined along a bottom surface of the MAB.
Figure 1B:
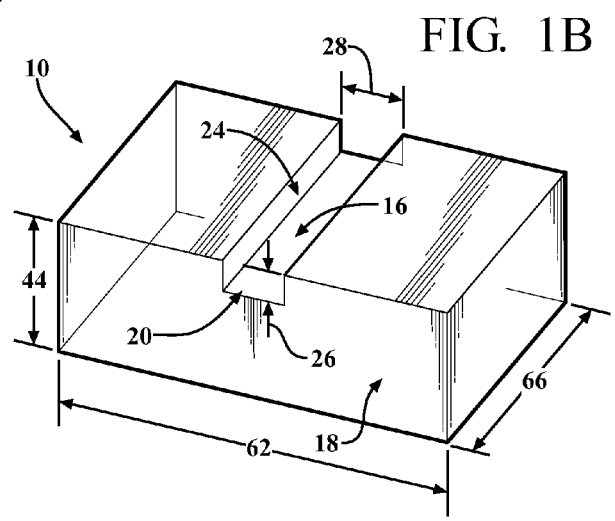
FIG. 1B is a schematic perspective view of a MAB defining a channel and having a sidewall defining an aperture into the channel with the channel defined along a bottom surface of the MAB.
Figure 1C:
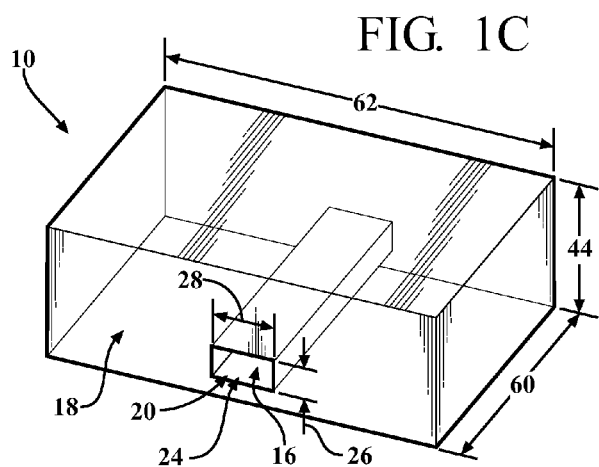
FIG. 1C is a schematic perspective view of a MAB defining a channel and having a sidewall defining an aperture into the channel with the channel defined through the MAB.

Referring to the Figures, wherein like numerals indicate like or corresponding parts, the microfluidic assembly block 10, herein after referred to as the MAB 10, is generally shown in FIGS. 1A-1C. The MAB 10 defines a channel 16 and has a sidewall 18 that defines an aperture 20 into the channel 16.

The channel 16 can be defined on a surface 22 of the MAB 10, as shown in FIGS. 1A and 1B or the channel 16 can be defined through the MAB 10, as shown in FIG. 1C. The channel 16 of the MAB 10 can also be partially defined on the surface 22 of the MAB 10 and partially defined through the MAB 10. In other words, the channel 16 can run along the surface 22 of the MAB 10 and through the same MAB 10. If the channel 16 is defined on the surface 22 of the MAB 10, the channel 16 may be further defined when the MAB 10 is placed on the base substrate 14, with a surface of the base substrate 14 forming a wall of the channel 16. In both cases, the sidewall 18 defines at least one aperture 20 into the channel 16.

The channel 16 is not limited to any particular cross-sectional profile 24. For example, the channel 16 can have a rectangular cross-sectional profile 24, as shown in FIGS. 1A-1C, or the channel 16 can have a tubular cross-sectional profile 24 (not shown). The cross-sectional profile 24 can typically be characterized by a depth 26 and a width 28. For example, the channel 16 may have a depth 26 of greater than 5 μm and a width 28 of greater than 5 μm. The depth 26 of the channel 16 is typically from 5 to 1,000, alternatively from 20 to 1,000, alternatively from 50 to 150 μm. The width 28 of the channel 16 is typically from 5 to 10,000, alternatively from 50 to 1,000, alternatively from 100 to 500 μm. It is to be appreciated that the cross-sectional profile dimensions of the channel 16 can vary within the MAB 10.

Figure 11A:
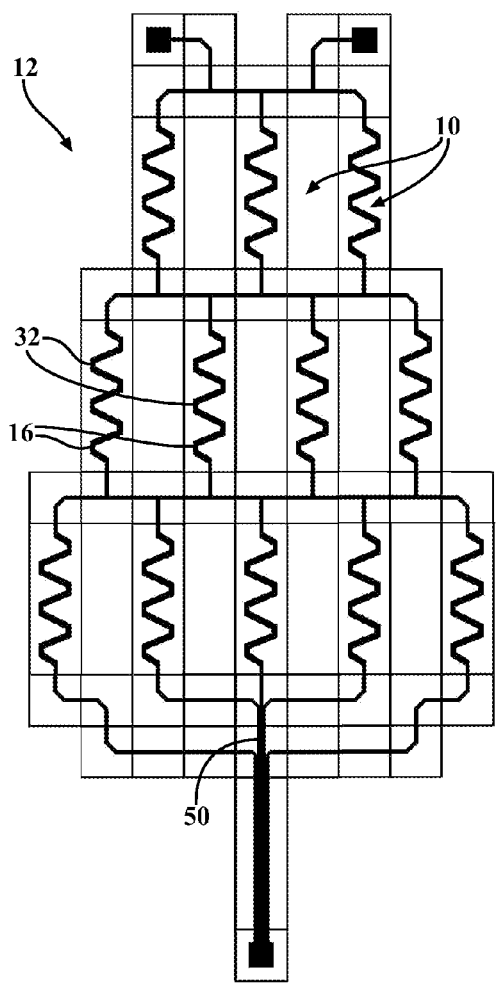
FIG. 11A is a schematic top view of a specific example of the microfluidic device designed for biochemical assays. The microfluidic device can generate five different concentration levels of a two-sample mixture.
Figure 11B:
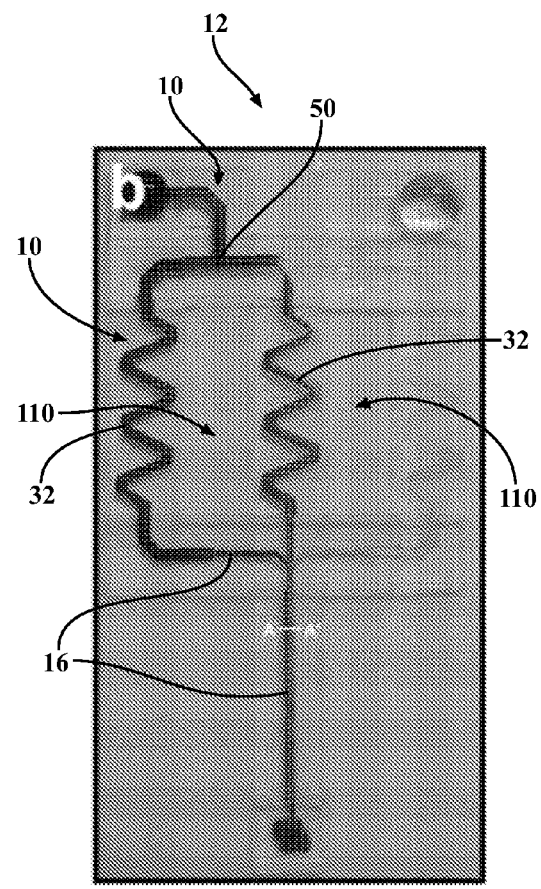
FIG. 11B is a top view photograph of another specific example of the microfluidic device for biochemical assays that mixes blue dye and water into an outgoing stream with three different concentration levels.
Figure 11C:
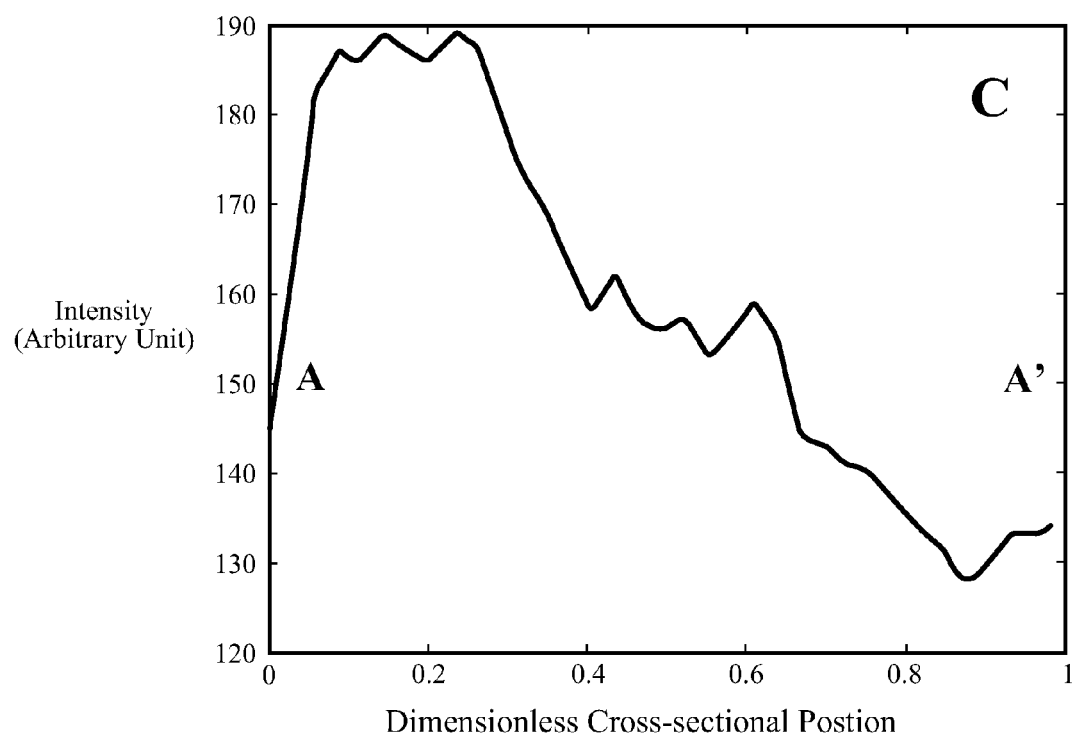
FIG. 11C is a graph showing blue dye concentration gradients across the cross-section at A-A' in FIG. 10B.

The various MABs 10 perform specific functions when arranged on the base substrate 14 depending on a configuration of the channel 16. As such, the channels 16 of the various MABs 10 can have different configurations. For example, the channel 16 may be defined in an inlet/outlet configuration 30 for the purpose of inserting into or withdrawing fluid from the microfluidic device 12, as shown in FIG. 8. This embodiment of the MAB 10 can be used to connect the microfluidic device 12 to a fluid source or to another microfluidic device 12. As another example, the channel 16 may be defined in a zigzag configuration 32 for the purpose of mixing different fluids in the microfluidic device 12. The zigzag channel configuration and size can vary, depending on the degree of mixing required and the particular microfluidic device 12. The MAB 10 of this embodiment can be used in a molecular gradient generator, as shown in FIGS. 11A-11C. As yet another example, the channel 16 may be defined in a culture bed configuration in which a culture can be grown. The size of the culture bed, as well as the configuration within the culture bed, may vary depending on the particular culture to be performed and the particular microfluidic device 12.

Figure 8A:
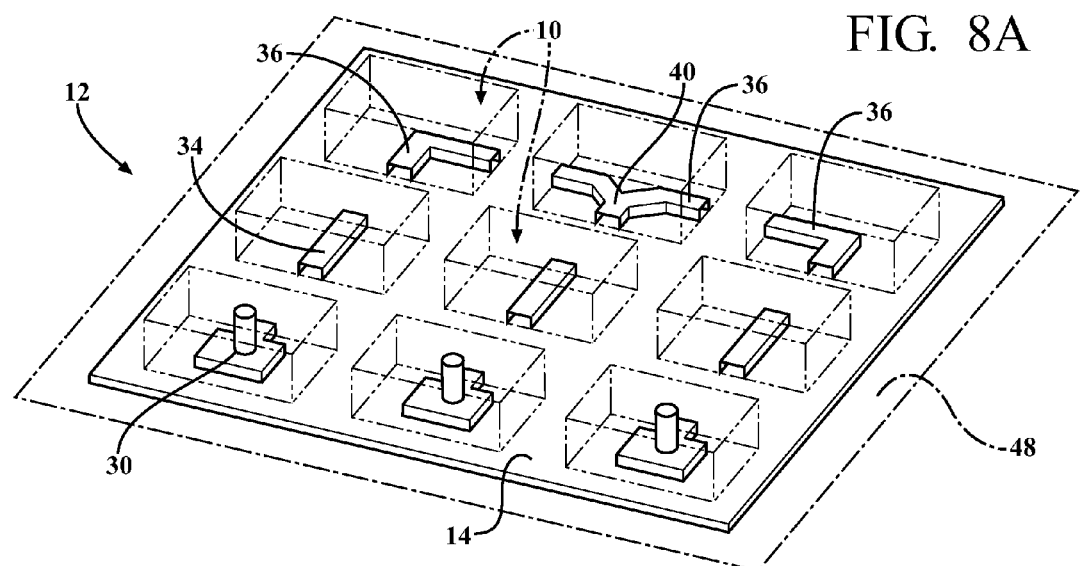
FIG. 8A is a schematic perspective view of one example of a plurality of MABs on a base substrate.
Figure 8B:
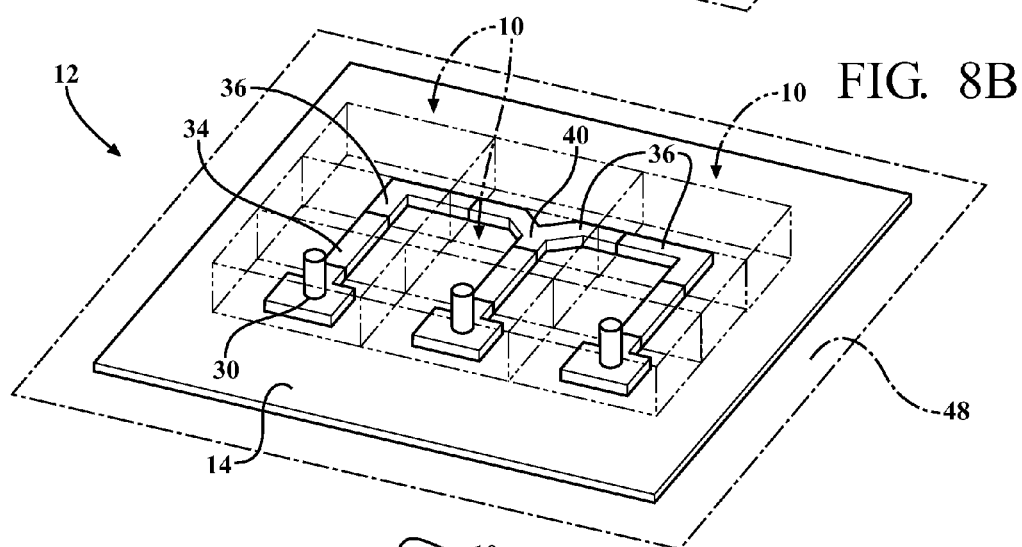
FIG. 8B is a schematic perspective view of the plurality of MABs of FIG. 8A arranged on the base substrate to form a microfluidic device.

The channel 16 can be configured to allow movement of fluid within the microfluidic device 12. In one such embodiment, the channel 16 may be defined in a straight configuration 34 through which fluid can flow within the microfluidic device 12, as seen in FIGS. 1A-1C. In another such embodiment, the channel 16 may be defined in a 90° curved configuration 36 through which fluid flowing in a first direction can be turned 90° relative to the first direction within the microfluidic device 12, as shown in FIGS. 8A and 8B, in which the channel 16 is defined in a 90° curved configuration 36. In yet another such embodiment, the channel 16 may be defined in a connector configuration which can connect two other MABs 10 that define the channel 16 having different sizes within the microfluidic device 12.

Figure 7A:
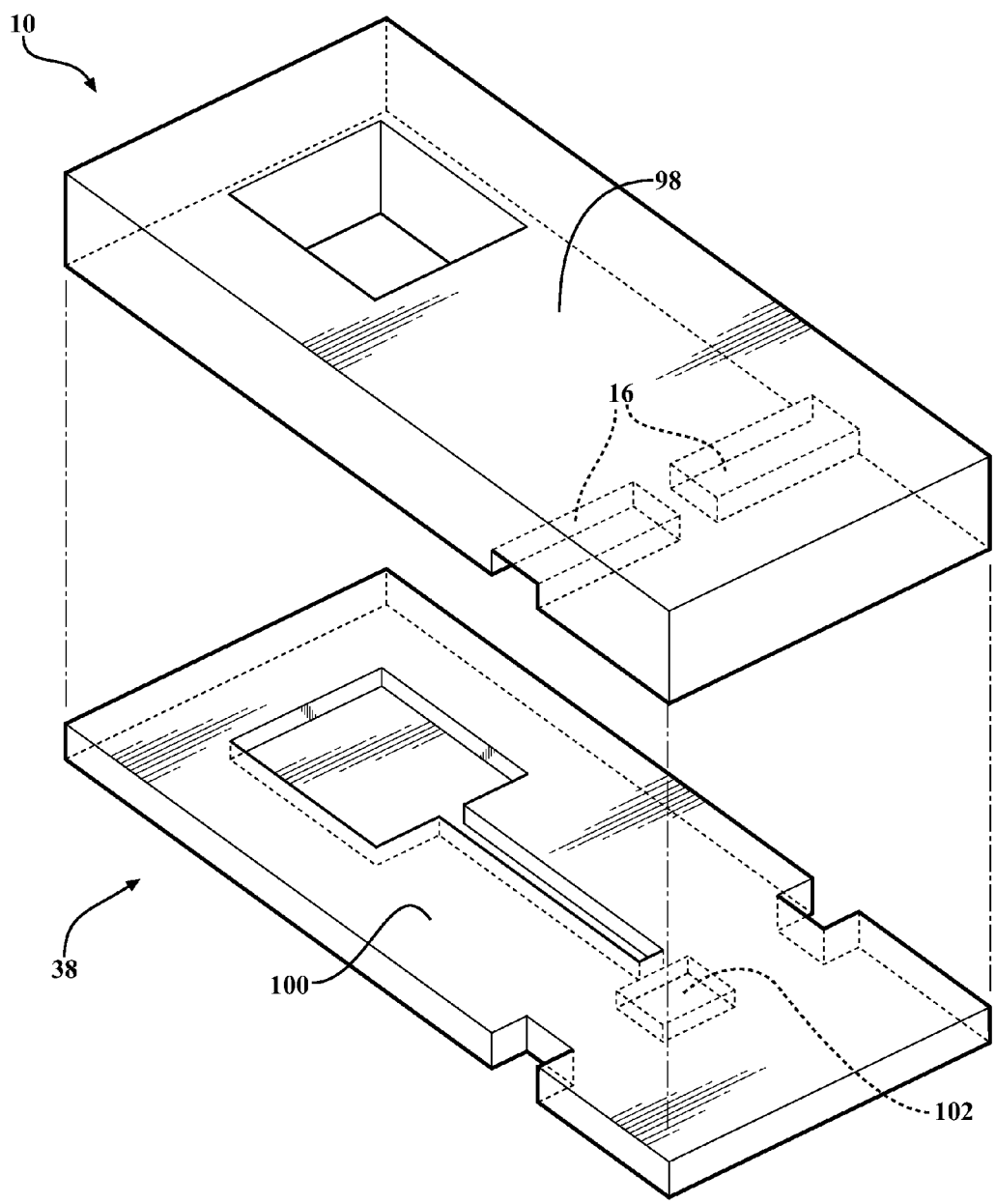
FIG. 7A is an exploded perspective view of a MAB defining a channel that provides a valve.
Figure 7B:
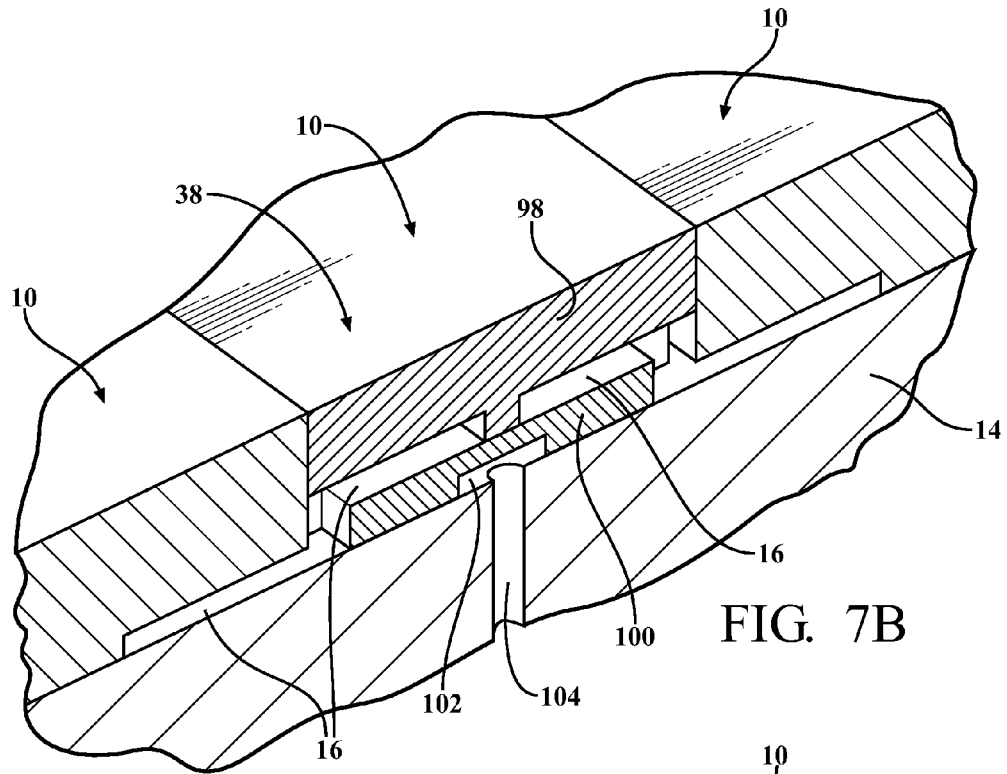
FIG. 7B is a perspective cross-section view of the MAB of FIG. 7A with the valve in a closed position.
Figure 7C:
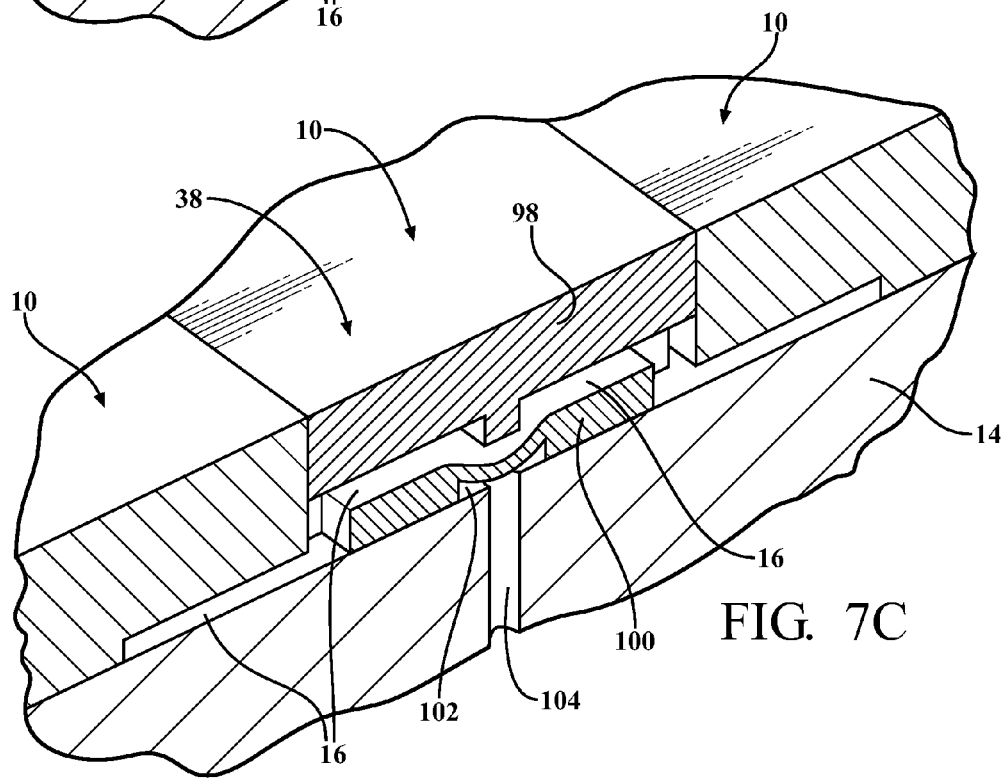
FIG. 7C is a perspective cross-section view of the MAB of FIG. 7A with the valve in an open position.

The MAB 10 can also provide a valve within the microfluidic device 12. In one such embodiment, the channel 16 may be defined in a pneumatic valve configuration 38 which can either restrict or allow movement of fluid within the microfluidic device 12. As shown in FIG. 7B, the valve is normally closed. However, when a vacuum is applied to the valve, the valve opens, as shown in FIG. 7C. The design and fabrication of this MAB 10 is discussed further below. In another such embodiment, the channel 16 may be defined in a bypass valve configuration which can either restrict or allow movement of fluid in a gaseous state within the microfluidic device 12.

The MAB 10 can also define the channel 16 configured to either merge or divide fluid flowing within the microfluidic device 12. In one such embodiment, the channel 16 may be defined in a T configuration which can divert fluid flowing through one channel into two channels or, alternatively, fluid flowing through two channels can be merged into one channel within the microfluidic device 12. In another such embodiment, the channel 16 may be defined in a Y configuration 40 which can divert fluid flowing through one channel into two channels or, alternatively, fluid flowing through two channels can be merged into one channel within the microfluidic device 12, as shown in FIG. 8A. In yet another such embodiment, the channel 16 may be defined in a cross configuration. The channel 16 of the cross configuration is designed to merge fluid flowing through three channels into one channel or, alternatively, divide fluid flowing through one channel into three channels within the microfluidic device 12.

The channel 16 may also be defined with a configuration to store fluid or conduct a cell culture or a chemical reaction within the microfluidic device 12. One such embodiment of the MAB 10, shown in FIG. 12, defines the channel 16 in a chamber configuration 42. The size of the chamber may vary depending on the purpose for the chamber, e.g., for particular reactions or for particular storage requirements.

It should be appreciated that particular channels 16 described herein are exemplary and are not intended to be limiting. Many modifications and variations can be made to the channel 16, as will be apparent to those skilled in the art.

As alluded to above, the plurality of the MABs 10 are typically arranged on the base substrate 14. More specifically, the sidewall 18 of one MAB 10 typically abuts the sidewall 18 of another MAB 10 or MABs 10 to form the microfluidic device 12. Alternatively, as described in additional detail below, intervening structures such as grid walls on the base substrate 14 may be disposed between the MABs 10 with the intervening structure connecting the channels 16 of the MABs 10. Consequently, the features of the sidewall 18 such as shape, height (i.e., MAB 10 thickness 44), and an optional interlocking mechanism 46 (as described in further detail below) impact the assembly characteristics of the MAB 10. When the plurality of MABs 10 are arranged on the base substrate 14, the aperture 20 into the channel 16 of one MAB 10 aligns with the aperture 20 of another MAB 10 with the channels 16 thereof connected along the plane 48 parallel to the base substrate 14, thereby forming the channel network 50 defined by the plurality of MABs 10. The modular configuration of the MABs 10 allows for the plurality of MABs 10, defining various channels 16, to be arranged on the base substrate 14 in such a manner as to form a customized microfluidic device 12.

Figure 2A:
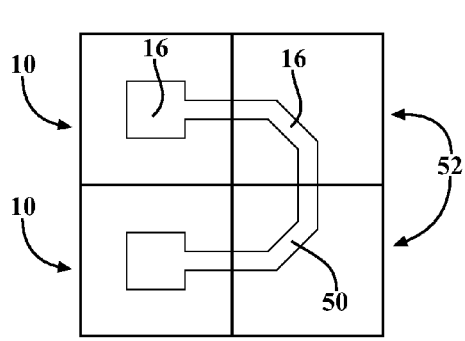
FIG. 2A is a schematic top view of a plurality of MABs having a rectangular shape and arranged with apertures of the various MABs aligned with apertures of other MABs.

The MABs 10 can have various shapes or combinations of shapes. For example, in one embodiment as shown in FIGS. 1A-1C, the MABs 10 are three dimensional rectangular prisms. As such, these MABs 10 have either a rectangular or a square cross-section. Such MABs 10 are herein referred to as having a rectangular shape 52. FIG. 2A also shows MABs 10 having the rectangular shape 52.

Figure 2B:
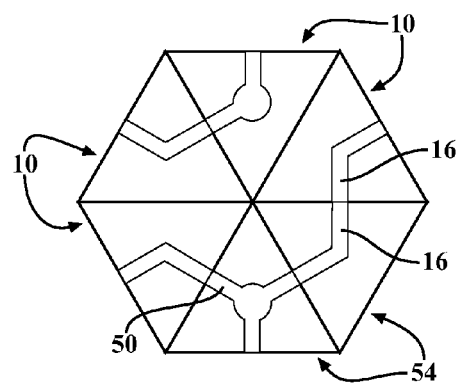
FIG. 2B is a schematic top view of a plurality of MABs having a triangular shape and arranged with apertures of the various MABs aligned with apertures of other MABs.
Figure 2C:
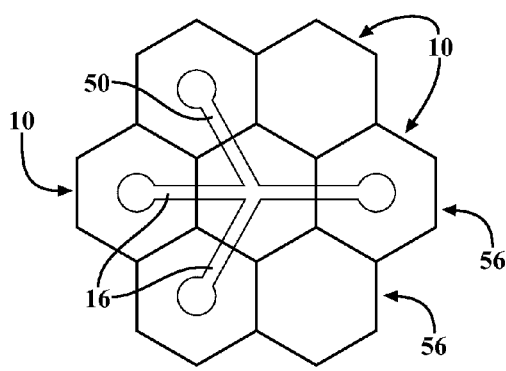
FIG. 2C is a schematic top view of a plurality of MABs having a hexagonal shape and arranged with apertures of the various MABs aligned with apertures of other MABs.
Figure 2D:
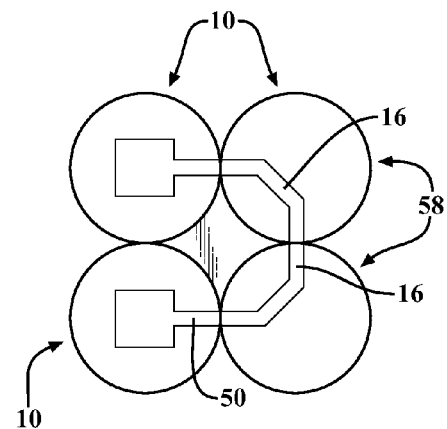
FIG. 2D is a schematic top view of a plurality of MABs having a circular shape and arranged with apertures of the various MABs aligned with apertures of other MABs.

In addition or as an alternative to the rectangular shape 52, the MABs 10 may have a shape selected from the group of: a triangular shape 54, as shown in FIG. 2B; a hexagonal shape 56, as shown in FIG. 2C; a circular shape 58, as shown in FIG. 2D; and combinations thereof. The shape of the MABs 10 influences assembly characteristics of the MABs 10. Said differently, when a plurality of MABs 10 having, e.g., the rectangular shape 52, are assembled on the base substrate 14, they fit together efficiently in a configuration, as shown in FIGS. 2A-2D. Accordingly, modifications to the shape of the MABs 10 can further change the characteristics and performance of the microfluidic device 12. However, it is to be appreciated that the MABs 10 can have any shape that enables assembly of the microfluidic device 12 and alignment of the apertures 20 of the various MABs 10. It is also to be appreciated that various embodiments of MABs 10 having a combination of different shapes can be assembled on the base substrate 14 to form the microfluidic device 12. Furthermore, the MABs 10 can be assembled in various configurations. For example, the MABs 10 having the circular shape 58, as shown in FIG. 2D, are assembled in a configuration such that the MABs 10 may be adjacently aligned with one another. However, the MABs 10 having the circular shape 58 could be assembled in a configuration such that they are staggeredly aligned with one another.

The MABs 10 are not limited to any particular size. Typically, the MABs 10 may have a length 60 of greater than 1 mm, a width 62 of greater than 1 mm, and a thickness 44 of greater than 100 μm. However, it is notable that the microfluidic device 12 is assembled using the MABs 10 and, therefore, the MABs 10 typically have small dimensions and may be relatively thin. As such, the MABs 10 typically have a length 60 of from 1 to 100, more typically of from 5 to 50, and most typically of from 10 to 20 mm. The width 62 of the MABs 10 is typically from 1 to 100, more typically of from 5 to 50, and most typically of from 10 to 20 mm. The thickness 44 of the MABs 10 is typically from 100 to 5,000, more typically from 200 to 4,000, and most typically from 300 to 3,000 μm. It is to be appreciated that the size of the MABs 10 can be scaled up or down for use in various microfluidic devices 12.

Figure 2E:
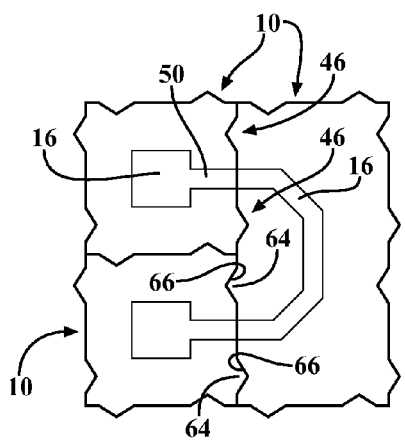
FIG. 2E is a schematic top view of another embodiment of a plurality of MABs comprising an interlocking mechanism operatively connecting the microfluidic assembly blocks to each other. The interlocking mechanism comprises a tab extending from a sidewall of one microfluidic assembly block and a recess defined by a sidewall of another microfluidic assembly block.
Figure 2F:
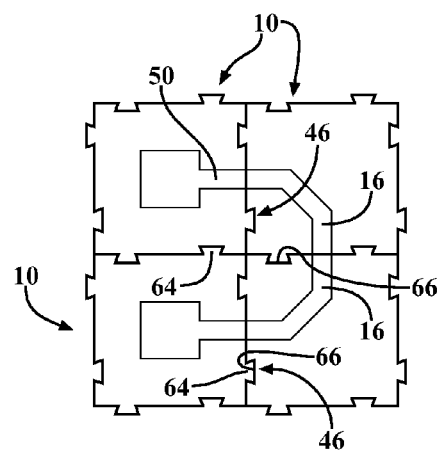
FIG. 2F is a schematic top view of yet another embodiment of a plurality of MABs comprising an interlocking mechanism operatively connecting the microfluidic assembly blocks to each other. The interlocking mechanism comprises a tab extending from a sidewall of one microfluidic assembly block and a recess defined by a sidewall of another microfluidic assembly block.

The MABs 10 can also comprise an interlocking mechanism 46 for operatively connecting the MABs 10 to each other. In one embodiment, as shown in FIGS. 2E, 2F, 3A, 3B, and 4, the interlocking mechanism 46 comprises a tab 64 extending from the sidewall 18 of one MAB 10 and a recess 66 defined by the sidewall 18 of another MAB 10. Generally, the tab 64 interlocks with the recess 66 to provide accurate alignment of the MABs 10. It should be appreciated that each individual MAB 10 can have one or more sidewalls 18 and each sidewall 18 can define recesses 66 and have tabs 64. Also, one or more recesses 66 can be defined by each sidewall 18 and one or more tabs 64 can extend from each sidewall 18. The geometry of the tab 64 and the recess 66 is not limited so long as the tab 64 is capable of interlocking with the recess 66. In one embodiment, the tab 64 extends from the sidewall 18 at an obtuse angle as shown in FIG. 2E. In this regard, interlocking does not necessarily require that the tab 64 is physically hindered from disengaging with from the recess 66. In other words, the MABs 10 can be interlocked by alignment on the base substrate 14 via insertion of the tab 64 into the recess 66, along the plane 48 parallel to the base substrate 14. In another embodiment, the tab 64 extends from the sidewall 18 at an acute angle as shown in FIG. 2F. As shown in FIGS. 2E, 2F, 3A, 3B, and 4, the tabs 64 interlock with the recesses 66 to provide accurate alignment of the MABs 10 and the channels 16 thereof when arranged on the base substrate 14 to form the microfluidic device 12.

Referring now to FIG. 3A, in one embodiment the channel 16 defined by the first MAB 10 is aligned with the channel 16 defined by the second MAB 10 with the aperture 20 defined through the sidewall 18 outside the tab 64 or the recess 66. In contrast, in the embodiment as shown in FIG. 3B, the channel 16 defined by the first MAB 10 is aligned with the channel 16 defined by the second MAB 10 with the aperture 20 defined through the sidewall 18 at one or more of the tabs 64 and the recesses 66, e.g., the channel 16 is further defined by one or more of the tabs 64 of the MABs 10. Said differently, in the embodiment of FIG. 3B the channel 16 runs through the tab 64 of the second MAB 10.

In one embodiment, FIG. 4, the tab 64 has a convex surface 68 having a radius 70 and defining an aperture 20 thereon formed by the channel 16, and the recess 66 defines a concave surface 72 having a radius 74 that also has the aperture 20 into the channel 16 of the MAB 10 defined at the convex surface 68. The radius 70 of the convex surface 68 is different than the radius 74 of the concave surface 72 such that when the MABs 10 are interlocked, as shown in FIG. 4, the convex surface 68 and the concave surface 72 of cooperating MABs 10 cooperate to create mechanical stress between the tab 64 and the recess 66, thereby hermetically sealing the channels 16. In addition to the mechanical stress created between the MABs 10, a gap between the convex surface 68 of the tab 64 and the concave surface 72 of the recess 66 can be changed. For example, should the radius 70 of the convex surface 68 of the tab 64 be less than the radius 74 of the concave surface 72 of the recess 66, the gap between the surfaces 68, 72 near the apertures 20 is minimized to seal the channels 16. Alternatively, should the radius 70 of the convex surface 68 of the tab 64 be greater than the radius 74 of the concave surface 72 of the recess 66, the gap is larger between the surfaces near the apertures 20 and the adhesive component can be used to seal the channels 16.

The interlocking mechanism 46 is not limited to the embodiments described above. In particular, the interlocking mechanism 46 is not limited to the tab 64 extending from the sidewall 18 of one MAB 10 and the recess 66 defined by the sidewall 18 of another MAB 10. For example, the tab 64 may extend from the surface of one MAB 10 and interlock with the surface of another MAB 10.

The MAB 10 can comprise various materials. However, the MAB 10 typically comprises a polymer or like material. The MAB 10 can comprise any flexible polymer. In one embodiment, the MAB 10 comprises an elastomeric polymer. The polymer may be physically manipulated to form the MAB 10 or can be formed from a curing pre-cursor material 92. The pre-cursor material 92 can comprise a pre-polymer, which can comprise monomers, oligomers, polymers, curing agent, fillers, and other additives known in the art. One specific example of a final polymer is a polysiloxane such as polydimethylsiloxane, herein referred to as PDMS. Typically the MAB 10 comprises the polymer in an amount of at least 95% by weight based on the total weight of the MAB 10. MABs 10 comprising different materials have different chemical and physical properties. For example, the MABs can comprise glass or glass-like materials as an alternative or in addition to the polymer. As such, the MABs 10 may be of any color, and may be clear, opaque, or transparent. The MABs 10 may also be smooth or rough. Typically, the surface 22 of the MAB 10 is smooth so that when the MAB 10 is arranged on the base substrate 14, the surface 22 and the base substrate 14 may hermetically seal the channel 16. Other surfaces, such as a top surface of the MAB 10, may be rough so long as additional layers are not bonded on the rough surfaces.

Any technique known in the art can be used to fabricate the MABs 10. For example, the MABs 10 can be fabricated using a standard soft-lithographic technique. Generally, the technique includes making a master mold, molding material in the master mold 76, and removing the MAB 10 from the master mold 76.

Figure 9A:
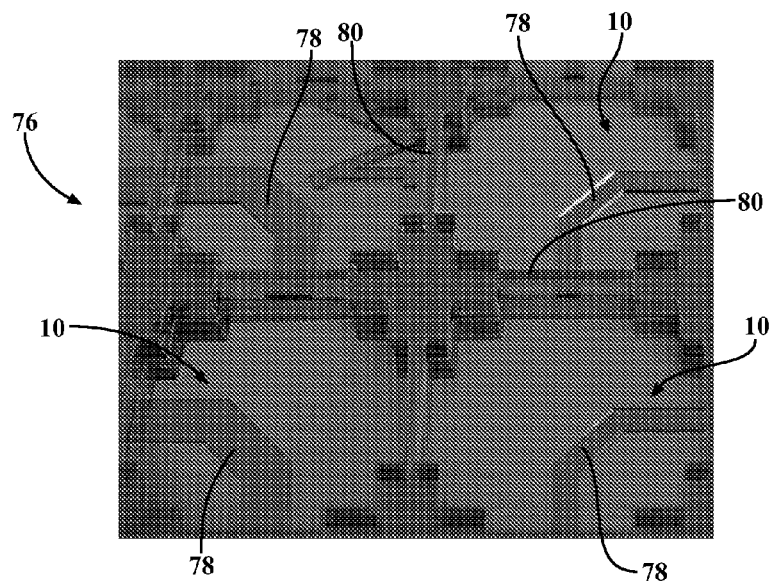
FIG. 9A is a top view photograph of a master mold used to form an embodiment of the MAB for a microfluidic device comprising a base substrate having cross shaped alignment posts.

Typically, the master mold 76 has channel patterns 78, as shown in FIG. 9A. The channel patterns 78 may form the channel 16 of the MAB 10. Similar to the channel 16 that is formed by the channel pattern 78, the channel pattern 78 may have the same dimensions as the channels 16 as set forth above. The master mold 76 also typically has grid patterns 80, as shown in FIG. 9A. The grid patterns 80 form the shape of the MAB 10 and may be used to control the thickness 44 of the MAB 10. Said differently, the grid patterns 80 form the sidewalls 18 of the MAB 10 and may have the same height as set forth above for thickness 44 of the MABs 10.

Figure 5A:
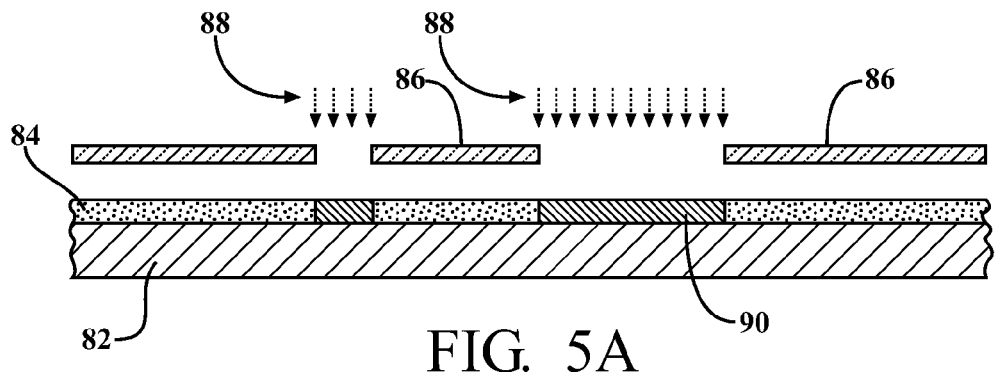
FIG. 5A is a schematic cross-sectional side view of a wafer in a MAB fabrication process in which a resist composition is spun on the wafer to form a resist coating and pre-baked on a hot plate for 5 minutes at 65° C., for an additional 20 minutes at 95° C. The resist coating is selectively exposed to UV light to form cured resist sections.
Figure 5B:
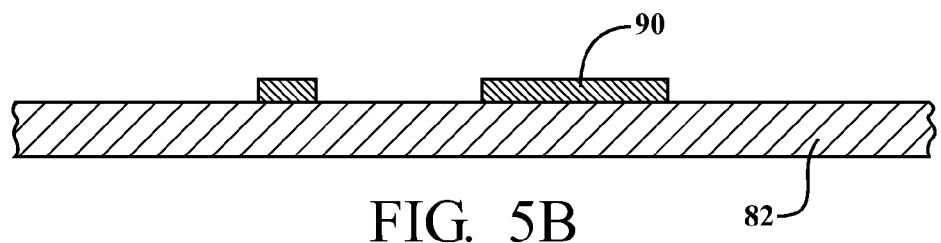
FIG. 5B is a schematic cross-sectional side view of the wafer in the MAB fabrication process of FIG. 5A after post-exposure baking for 1 minute at 65° C. and for 10 minutes at 95° C., and after the wafer is immersed and developed in a developer solution to remove the uncured resist coating from the wafer.
Figure 5C:
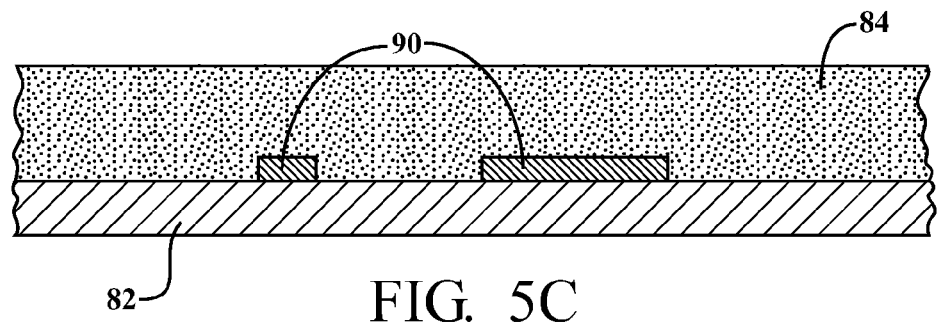
FIG. 5C is a schematic cross-sectional side view of the wafer in the MAB fabrication process of FIG. 5B after additional resist composition is repeatedly spun onto the wafer and pre-baked until a desired thickness of the resist coating is obtained.
Figure 5D:
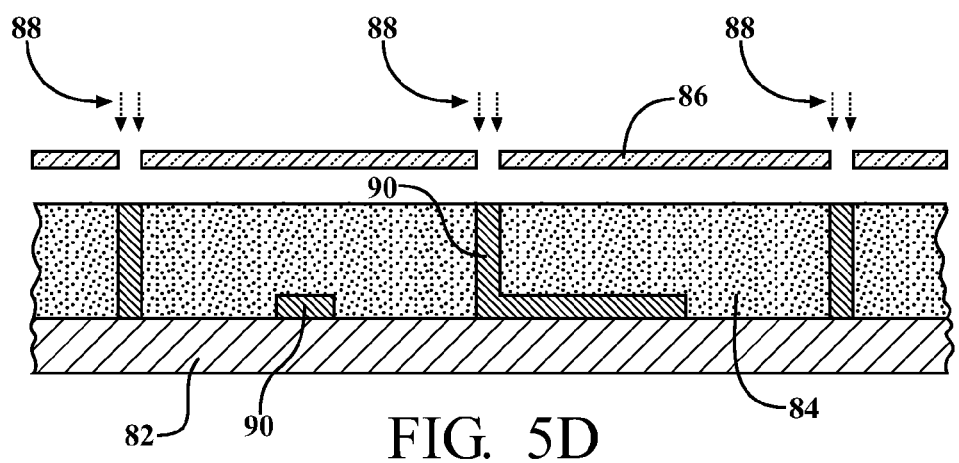
FIG. 5D is a schematic cross-sectional side view of the wafer in the MAB fabrication process of FIG. 5C in which the resist coating is selectively exposed to UV light to form cured resist sections.
Figure 5E:
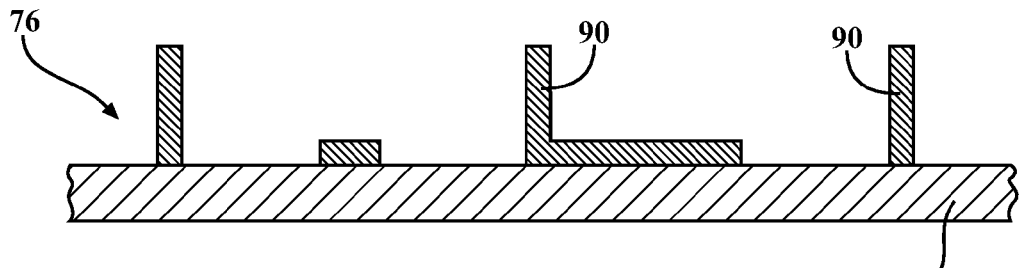
FIG. 5E is a schematic cross-sectional side view of the of the wafer including cured resist sections in the MAB fabrication process of FIG. 5D after post-exposure baking and development in which uncured resist coating has been removed from the wafer. Master mold fabrication is complete at this step.

To form the master mold 76 having the channel patterns 78 and the grid patterns 80, a resist composition may be spun onto a wafer 82 in multiple repetitions to form a resist coating 84. The resist coating 84 is then cured to form resist sections 90, i.e., the channel and grid patterns 78, 80. The wafer 82 is typically formed from silicon, glass or like material. However, the wafer 82 may be formed from any suitable material known to those skilled in the art. A particularly suitable wafer 82 is formed from silicon. The resist composition may comprise a polymer or pre-cursor thereof. Resist compositions are known to those skilled in the art. A particularly suitable resist composition is an epoxy resist composition such as NANA™ SU-8 2025, commercially produced by MicroChem of Newton, Mass. One embodiment of the master mold 76 fabrication process is depicted in FIGS. 5A-5F. The MAB 10 fabrication process starts with the fabrication of the master mold 76. First, as shown in FIG. 5A, the resist composition (e.g., NANA™ SU-8 2025) is spun on the silicon wafer 82 to form the resist coating 84 and photo masked according to channel and grid patterns 78, 80 required for the desired MAB 10. A layer of the resist coating 84 approximately 75 μm thick is obtained when the resist composition is spun on the silicon wafer 82 once. As shown in FIG. 5B, the silicon wafer 82 having the resist coating 84 thereon is cured by heating for 1 minute at 65° C., and is further heated for 10 minutes at 95° C. to form the resist sections 90. Shortly thereafter, the wafer 82 having the resist sections 90 thereon is developed in developer solution to wash away the uncured resist coating 84, as shown in FIG. 5C. The resist composition is spun onto the silicon wafer 82 having the resist sections 90 thereon and pre-baked repeatedly until the resist sections 90 having dimensions desired are obtained. The height of the resist sections 90 may be measured with a mechanical height gauge. As shown in FIG. 5D, the silicon wafer 82 is masked with a photomask 86, aligned to alignment cross marks, and exposed to 365 nm UV light 88. Excess, uncured resist coating 84 may be removed to reveal the master mold 76 which is complete and has the resist sections 90, i.e., the channel and grid patterns 78, 80 desired, as shown in FIG. 5E. Dimensions of the master mold 76 may be analyzed on a surface profiler (Alpha-Step 500, KLA-Tencor). The surface of the master mold 76 comprising the silicon wafer 82 having channel and grid patterns 78, 80 thereon may be then cleaned.

Figure 5F:
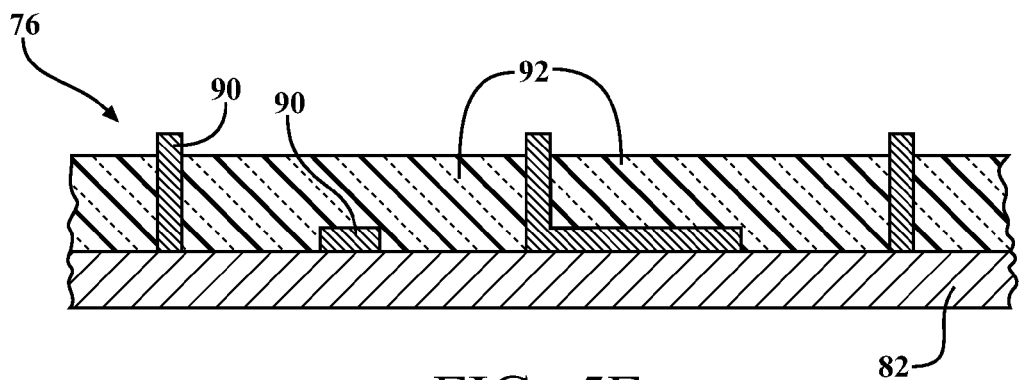
FIG. 5F is a schematic cross-sectional side view of the wafer in the MAB fabrication process of FIG. 5E in which a pre-cursor material is cast in the master mold and hardened to form the MABs.
Figure 5G:
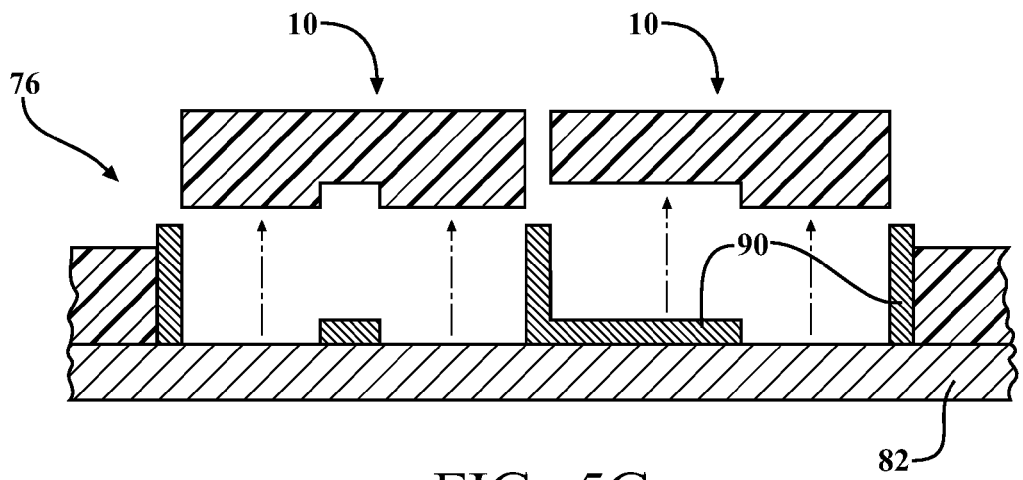
FIG. 5G is a schematic cross-sectional side view of the master mold and the MABs in the MAB fabrication process of FIG. 5F in which the MABs are removed from the master mold.

Once the master mold 76 is fabricated, the MAB 10 is fabricated therein as shown in FIGS. 5E-5G. The pre-cursor material 92, such as a 9:1 mixture of the pre-polymer and the curing agent, is cast in the master mold 76. In the case of MABs 10 comprising PDMS and formed from the pre-polymer and the curing agent, the mixing ratio of the pre-polymer and curing agent affects the peelability of the MABs 10 from the master mold 76. For example, a mixing ratio greater than 10:1 (pre-polymer:curing agent) may result in MABs 10 that are elastic and flimsy. Such MABs 10 may rupture during removal from the master mold 76. In contrast, a mixing ratio of less than 5:1 causes the MABs 10 to adhere to the master mold 76, resulting in MAB 10 damage during forced extraction. However, when a mixing ratio such as 5:1 is employed, silanization of the master mold 76 may help facilitate the removal of the MABs 10. Once cast, excess pre-cursor material 92 may be removed from the surface of the master mold 76, for example, by using a razor blade. The MABs 10, once removed from the master mold 76, generally have clean, flat vertical edges on their sides. However, it is to be appreciated that the instant invention is not limited to a particular shape of the edges, which may be other than vertical. Once cast, excess pre-cursor material 92 may be removed from the surface of the master mold 76, for example, by using a razor blade. The pre-cursor material 92 is then hardened to form the MAB 10. The hardening process may vary depending on the pre-cursor material 92 selected and may involve curing the pre-cursor material 92 or merely cooling the pre-cursor material 92 (e.g., when the pre-cursor material 92 is a thermoplastic). The MAB 10 is carefully removed from the master mold 76, typically with a sharp aluminum syringe needle.

Figure 6A:
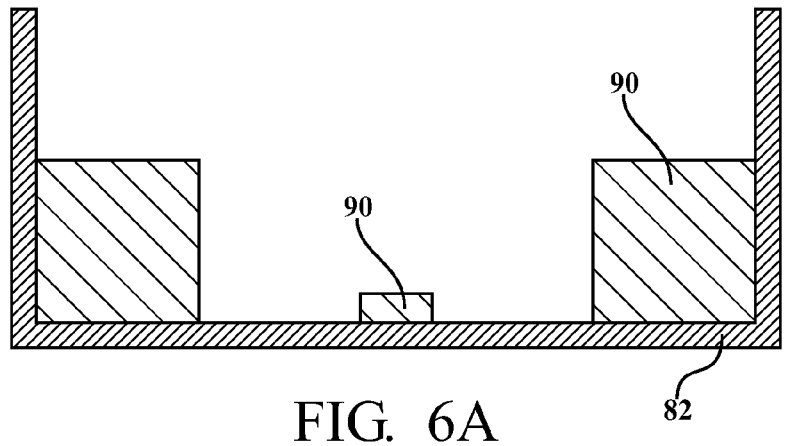
FIG. 6A is a schematic cross-sectional side view of a first pre-mold in another embodiment of a MAB fabrication process in which a resist coating is cured on a silicon wafer.
Figure 6B:
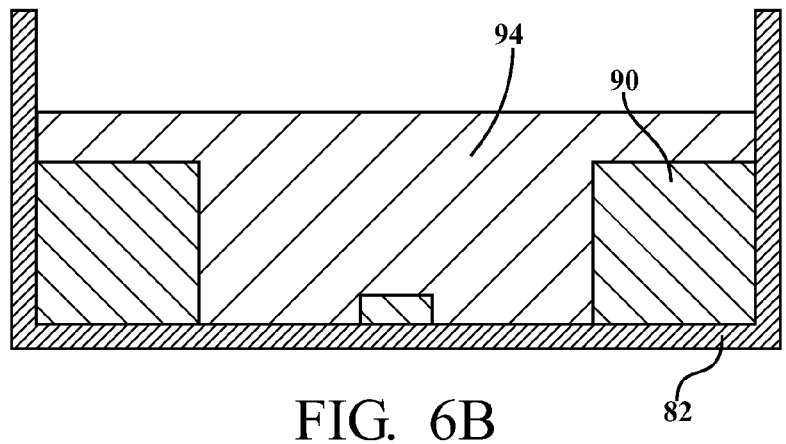
FIG. 6B is a schematic cross-sectional side view of the first pre-mold in the MAB fabrication process in which a pre-cursor material is cast in the first pre-mold to form a second pre-mold.
Figure 6C:
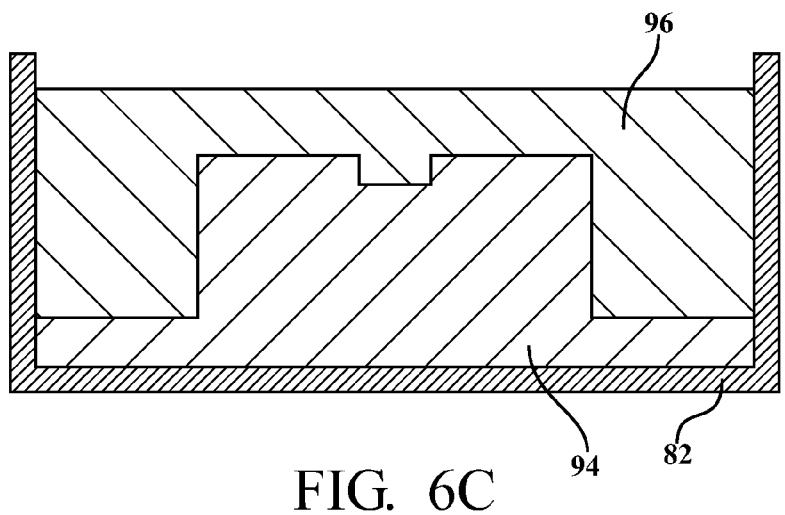
FIG. 6C is a schematic cross-sectional side view of the second pre-mold in the MAB fabrication process of FIG. 6B having pre-cursor material thereon to form a flexible master mold therein.
Figure 6D:
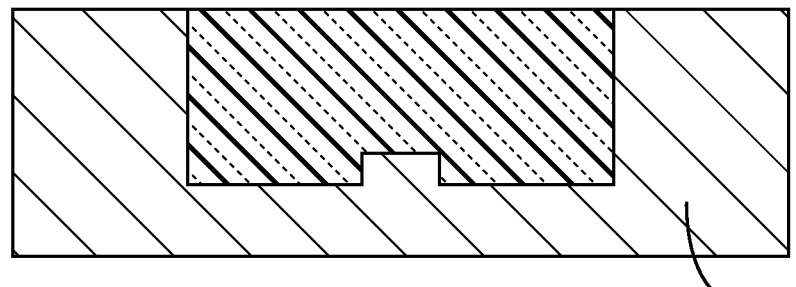
FIG. 6D is a schematic cross-sectional side view of the flexible master mold in the MAB fabrication process of FIG. 6C having pre-cursor material thereon to form an MAB therein.
Figure 6E:
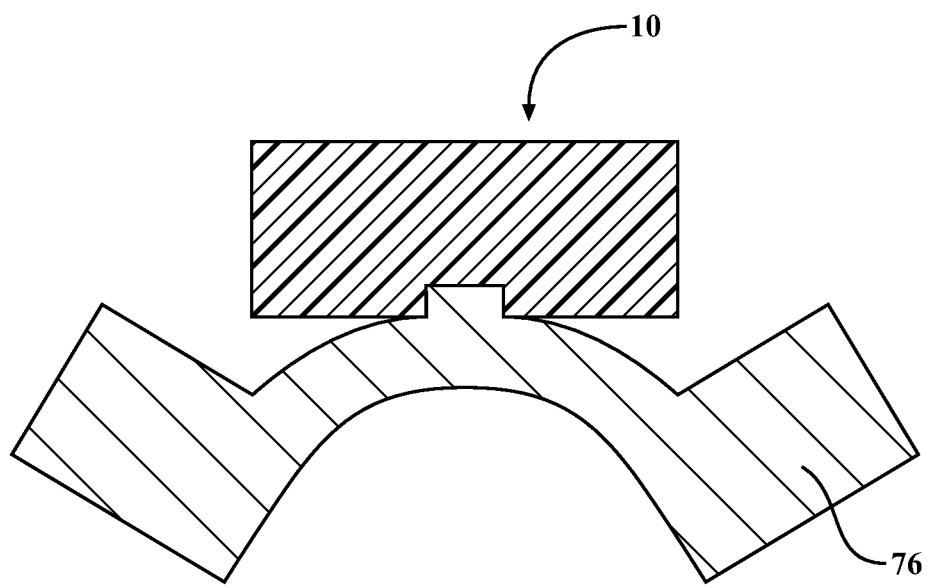
FIG. 6E is a schematic cross-sectional side view of the flexible master mold in the MAB fabrication process of FIG. 6D peeled back to provide the MAB.

Another embodiment of the MAB 10 fabrication process is depicted in FIGS. 6A-6E. Referring now to FIG. 6A, the resist composition is cured on a wafer 82 to form a first pre-mold 94. As shown in FIG. 6B, the pre-cursor material 92 is cast on the first pre-mold 94 and cured to form a second pre-mold 96. In FIG. 6C, the second pre-mold 96 is then positioned on the wafer 82 and the pre-cursor material 92 is cast on the second pre-mold 96. The cast pre-cursor material 92 is cured to form the flexible master mold 76 comprising polymer. In FIG. 6D, the pre-cursor material 92 is cast on the flexible master mold 76 and hardened to form the MAB 10 therein. Prior to casting the pre-cursor material 92, the surfaces of the flexible master mold 76 can be coated with a non-stick material, e.g., a release agent or coating, to prevent the MAB 10 from adhering to the flexible master mold 76. As shown in FIG. 6E, the flexible master mold 76 comprising polymer is peeled back to free the MAB 10 from the flexible master mold 76.

The MAB 10 fabrication process can vary depending on the MAB 10 required. For example, the fabrication of a MAB 10 defining the channel 16 in a valve configuration 38 can require additional steps. Referring now to FIGS. 7A-7C, the MAB 10 defining the channel 16 in the valve configuration 38 may include two layers: a top layer 98 defining the channel 16 and a bottom layer 100 defining a pneumatic control channel 102. Typically, a pneumatic feed channel 104 is drilled into the base substrate 14 with a luer stub. The valve opens when a vacuum is applied to the pneumatic control channel 102 through the pneumatic feed channel 104. FIG. 7B illustrates the valve in a closed position, whereas FIG. 7C illustrates the valve in an open position. To fabricate the top layer 98, soft lithographic techniques, like those described in the embodiments above, can be used. To fabricate the bottom layer 100, the pre-cursor material 92, such as a 10:1 mixture of pre-polymer and curing agent, is cast and spun onto the master mold 76 to form the bottom layer 100 therein. The bottom layer 100 is trimmed, if necessary, to fit into the top layer 98. The two layers are aligned, typically under a microscope, and bonded to each other to form the MAB 10 defining the channel 16 in the valve configuration 38.

It is to be appreciated that the above-described MAB 10 fabrication processes are exemplary rather that limiting in scope and that other MAB 10 fabrication processes are possible.

Figure 9B:
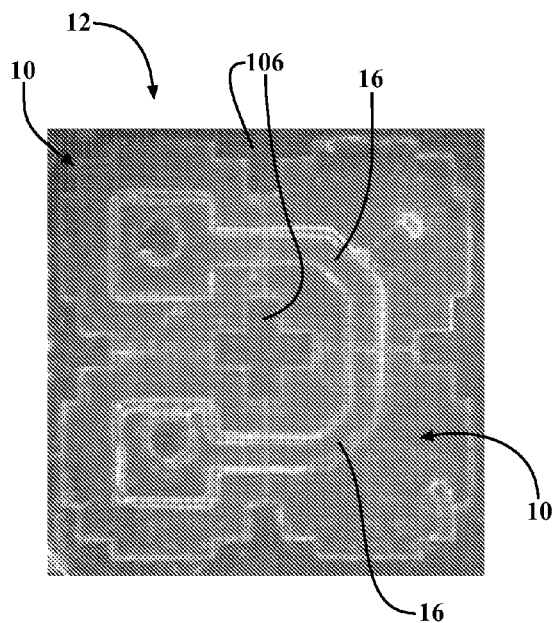
FIG. 9B is a top view photograph of a microfluidic device formed from a base substrate having cross-shaped alignment posts.
Figure 9C:
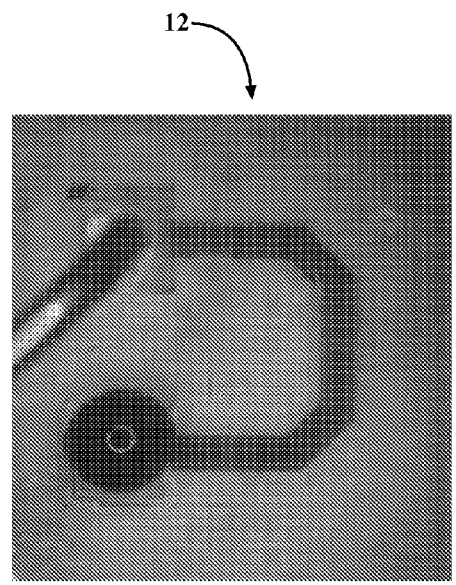
FIG. 9C is a top view photograph of the microfluidic device of FIG. 9B undergoing a fluidic test.

As alluded to above, the modular microfluidic system includes the base substrate 14. Suitable materials for the base substrate 14 include, but are not limited to, ceramics, glass, metals, polymers, and other like materials. In one embodiment, the base substrate 14 is a glass slide. Suitable glass slides are commercially available from Dow Corning of Midland, Mich. The base substrate 14 may also be coated to improve performance. In one embodiment the coating is a polymer. For example, the base substrate 14 may be coated with a siloxane coating such as a PDMS coating. One suitable coating for the base substrate 14 is PDMS coating formed from a 10:1 mixture of pre-polymer and curing agent spin coated onto the glass slide and cured to have a thickness of approximately 100 μm. Typically, the base substrate 14 is planar. However, the base substrate 14 can include a plurality of alignment posts 106, as shown in FIGS. 9A-9C. The alignment posts 106 constrain the MABs 10 in pre-defined areas on the base substrate 14 to improve MAB 10 alignment on the base substrate 14.

As also alluded to above, the modular microfluidic system includes the adhesive component to bond the MABs 10 and the base substrate 14 together. The adhesive component can comprise monomers, oligomers, polymers, additives, fillers, and other materials known in the art. For example, an adhesive component comprising a pre-adhesive material and a curative can be used. As another example, when MABs 10 comprising PDMS are used to form the microfluidic device 12, an adhesive component comprising the curing agent can be used. Generally, the adhesive component hardens, upon cooling or curing (depending on the adhesive component used), to form an adhesive coating 108. Typically the adhesive coating 108 comprises a polymer. A preferred adhesive coating 108 comprises a polysiloxane, such as PDMS. However, the instant invention is not limited to any particular adhesive component or adhesive coating 108 to bond the MABs 10 and the base substrate 14 together.

Referring again to FIGS. 8A and 8B, the present invention provides the method of assembling the microfluidic device 12. The method comprises the steps of providing the base substrate 14, providing the plurality of MABs 10, and arranging the plurality of MABs 10 on the base substrate 14. The MABs 10 are arranged on the base substrate 14 such that the aperture 20 into the channel 16 of one MAB 10 aligns with the aperture 20 of another MAB 10. As such, the channels 16 are connected along the plane 48 that is parallel to the base substrate 14 thereby forming the channel network 50 that is defined by the plurality of MABs 10. The plurality of MABs 10 are aligned on the base substrate 14 in accordance with an intended design to form custom microfluidic devices 12 for performing specific functions.

Typically, the method includes preparation of the base substrate 14. If the base substrate 14 is to be coated, the coating is formed on the base substrate 14.

Characteristics of the MAB 10, such as shape, may affect the step of arranging the MABs 10 on the base substrate 14. For example, the shape of the MAB 10 may affect the assembly characteristics of the MAB 10. The MAB 10 having the rectangular shape 52 is designed such that the MAB 10 can be rotated in 90° increments if a different orientation is needed when arranging the MAB 10 on the base substrate 14. When the microfluidic device 12 comprises MABs 10 having the rectangular shape 52, the MABs 10 may have variations in thickness 44. These variations in thickness 44 are due to the MAB 10 fabrication process. However, variations in thickness 44 of the MABs 10 having the rectangular shape 52 does not materially affect performance of the microfluidic device 12. Additionally, the MABs 10 having the rectangular shape 52 are designed to minimize interface area between the plurality of MABs 10 assembled on the base substrate 14. As the interface area between MABs 10 decreases, assembly of the microfluidic devices 12 therefrom is simplified and requires less elaborate bonding techniques. The MABs 10 having the rectangular shape 52 are easy to clean, minimizing effects of impurities such as residual adhesive component and common dust. In addition to the MAB 10 shape, the location of the channel 16 defined by the MAB 10 may also change the assembly characteristics of the MAB 10. Likewise, the use of MABs 10 having various interlocking mechanisms 46 and various base substrate 14 configurations may impact assembly characteristics and performance of the microfluidic device 12. Should the MABs 10 comprise the interlocking mechanism 46, the method may include the step of operatively connecting the MABs 10 to each other.

Overall, MAB 10 and base substrate 14 fabrication procedures are employed to provide an acceptable alignment of the MABs 10 and the base substrate 14. When arranging the plurality of MABs 10 on the base substrate 14 it, is desirable to minimize gaps between the MABs 10. Visual aids, such as a stereoscope, are not necessary but may facilitate the alignment of the MABs 10 on the base substrate 14. When the plurality of MABs 10 are aligned with tweezers, gaps of less than 5 μm between the plurality of MABs 10 can be repeatedly achieved. Further, a spacer MAB 110, which does not define the channel 16, is shown in FIG. 11B and can assist in the alignment of the MABs 110 on the base substrate 14. The spacer MAB 10 is designed to fill in space between MABs 10 or provide an end to the channel 16 of another MAB 10 within the microfluidic device 12.

Figure 8C:
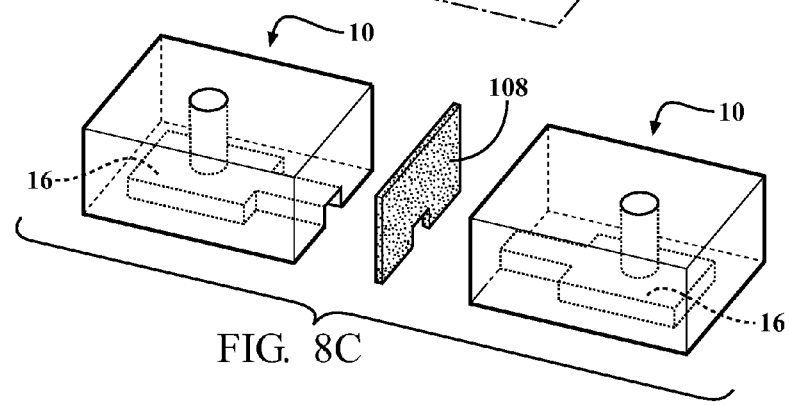
FIG. 8C is an exploded schematic perspective view of two MABs having an adhesive layer disposed therebetween.

Generally, the adhesive component is applied to the plurality of MABs 10 and/or to the base substrate 14 and hardens to form the adhesive coating 108, as shown in FIG. 8C. As such, the method also may include the step of applying the adhesive component to the plurality of MABs 10. In one embodiment, the MABs 10 are individually coated with the adhesive component. In another embodiment, the adhesive component is applied to the MABs 10 after they are assembled on the base substrate 14. As an example, a small volume, e.g., 1 μL per MAB 10 of the adhesive component, in liquid form, can be applied at the interface between the plurality MABs 10 of an assembled microfluidic device 12. In this example, the adhesive component spreads by capillary action. Should excessive adhesive component occupy the channel network 50, it can be aspirated. Depending on the adhesive component applied, the method may further comprise the step of curing the adhesive component with application of heat, infrared radiation, and/or ultraviolet radiation. Microfluidic devices 12 comprising cured adhesive components, i.e., the adhesive coating 108, such as those discussed above, may be immediately used for tests and experiments without extra wait time.

The adhesive coating 108 decreases the gaps between the plurality of MABs 10 and strengthens overall bonding of the MABs 10 and base substrate 14 of the microfluidic device 12. Preferably, the MAB 10 to base substrate 14 bonding and the inter-MAB bonding is hermetic to prevent fluidic loss. Since the sidewall 18 area of the MAB 10 available for bonding is relatively small, inherent inter-MAB adhesion does not provide significant inter-MAB bonding, even if two adjacent MABs 10 have formed gapless contact. Consequently, the adhesive coating 108 may be used to provide additional inter-MAB adhesion. In addition, the MAB 10 to base substrate 14 bonding and the elastic nature of the coating on the base substrate 14 may add an additional compressive force, along the plane 48 parallel to the base substrate 14, between the MABs 10 arranged on the base substrate 14 to seal the channel network 50.

The loss of liquid from the channel network 50 of the microfluidic device 12 is one consideration in device 12 design and fabrication. Even if every interface between the plurality of MABs 10 is hermetically sealed, evaporation may still occur by diffusion through the MABs 10. To address the time elapsed in evaporation through MABs 10 comprising PDMS, a dimensionless diffusion time is introduced to directly compare the evaporation results from various microfluidic devices 12 having different thicknesses. The dimensionless time, τ, is defined as, $$\tau = \frac{tD}{h^2}$$

In the above equation, t is the elapsed time, D is the estimated diffusion coefficient of water vapor through PDMS membrane (D is approximately $10^{-3}$ mm$^2$ s$^{-1}$), and h is the MAB 10 thickness over the channel network 50 corresponding to the difference between the MAB thickness and the channel depth (h ranges from 300 to 1100 μm). To address leakage out of imperfections in inter-MAB bonding, a ratio of exposed interface area per fluid volume (IF) was used as a parameter:

$$IF = \frac{\sum_i A_i}{V}$$

Figure 10A:
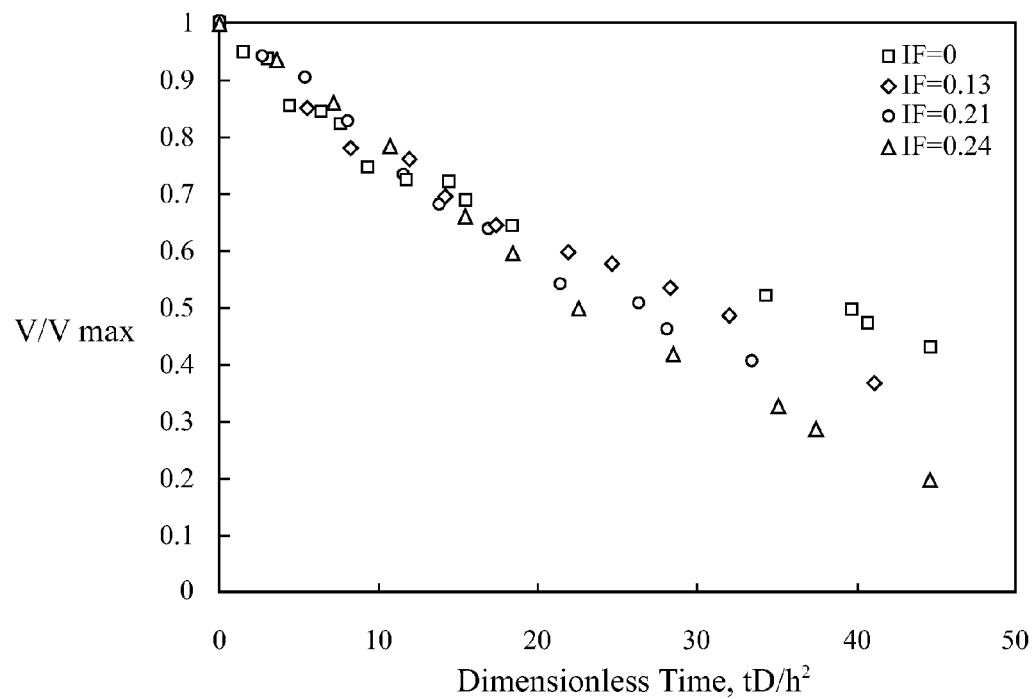
FIG. 10 presents two graphs demonstrating the effect of inter-MAB gaps on evaporation rate. The microfluidic devices are named according to their respective ratio of exposed interface area per fluid volume (IF). IF=0 is a completely closed microfluidic device while the microfluidic devices of non-zero IFs have inter-MAB gaps, with higher IF values corresponding to larger inter-MAB gaps. Graph (a) shows fluidic volume loss ($V/V_{max}$) to dimensionless time. No adhesive component has been applied to the microfluidic devices used to generate the data for graph (a). As demonstrated in graph (a), open gaps expedite evaporation. Graph (b) also shows fluidic volume loss to dimensionless time, but the adhesive component comprising a curing agent has been applied to the microfluidic devices used to generate the data for graph (b) except for the first device of IF=0. As demonstrated in graph (b), gaps filled with the adhesive component decrease evaporation rates.
Figure 10B:
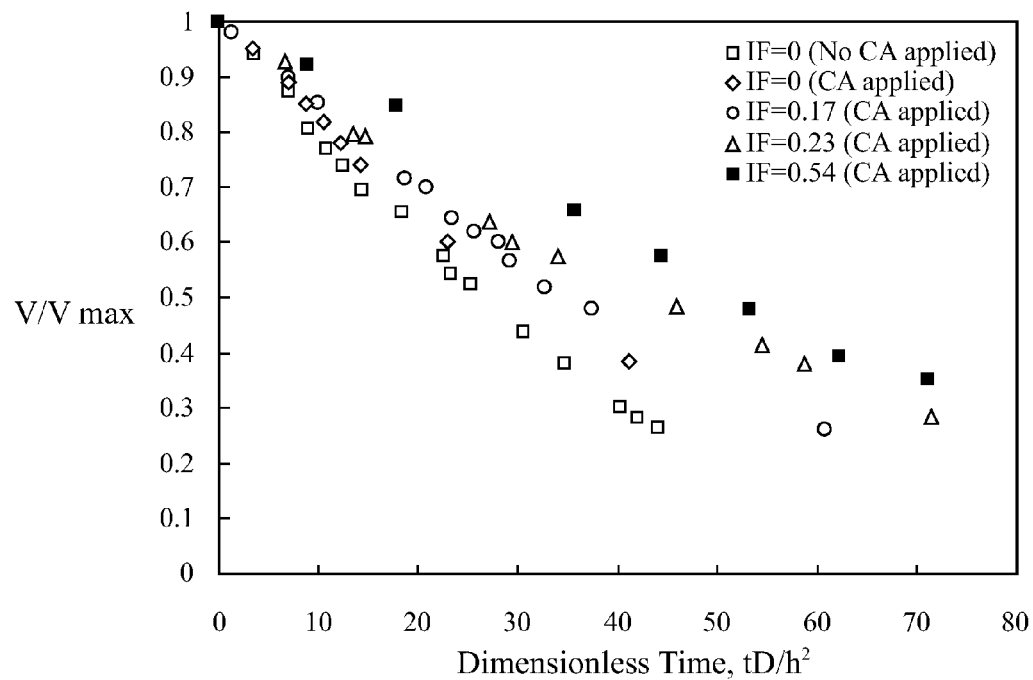

In this equation, $A_i$ indicates the interfacial area exposed to air at the i-th junction and V represents the total volume of fluid sample. $A_i$ is calculated using the average gap distance ($g_i$), the channel width (w), and the channel depth (d). Likewise, the fluid volume is calculated from the drop length (l) of fluid sample and the channel dimensions. Larger IF values indicate more exposure to air at junctions. Generally, the ratio of V to Vmax, where Vmax is an initial volume of fluid and V is a final volume of fluid, of about 1 is desired and is indicative of no fluid loss. The graphs of FIG. 10 illustrate the effect of gaps in the interface between the MABs 10 on the evaporation rate and confirm that the gaps of the microfluidic device 12 as described herein have a minor effect on the evaporation rate.

In a typical embodiment of the microfluidic device 12, the adhesion of the MABs 10 to the base substrate 12 is reversible and can withstand (i.e., not rupture) internal pressures up to 5 psi, which is a pressure high enough to perform pneumatically driven flow experiments in typical biochemical studies. Typically, the bonding of the MAB 10 to the base substrate 14 that is uncoated and to the base substrate 14 that is coated with PDMS can withstand 3-5 psi and 4-6 psi, respectively. The performance of a number of exemplary bonding techniques is documented in Table 1. In Table 1, the MABs 10 were bonded to one another and the base substrate 14 with three adhesive components (1) the PDMS mixture used to fabricate the MABs 10, (2) the curing agent, and (3) a UV-curable adhesive component. When placed around the microfluidic device 12, in contact with the MABs 10, the adhesive component flows into the inter-MAB interfaces as well as the MAB 10 to base substrate 14 interfaces due to capillary action. Curing the adhesive component then results in strong bonding at all interfaces. The microfluidic devices 12 treated with the three adhesive components can withstand inside pressures of >30 psi for 30 min. Interestingly, using the curing agent as the adhesive component is shown to further reduce the evaporation rate. Without being bound by theory, it is thought that the curing agent alone produces a higher degree of crosslinking during polymerization than the 9:1 PDMS pre-polymer and curing agent mixture. Notwithstanding the foregoing, it is to be appreciated that the instant invention is not limited to any particular adhesive component to bond the MABs 10 and the base substrate 14 together.

dimension of the roofed MAB 10 can cause vertical gaps between the roofed MABs 10 and the base substrate 14, resulting in a non hermetic seal.

TABLE 1

| Bonding Methods | Difficulty Level | Glass Base Substrate | | PDMS Coated Glass Base Substrate | |
|---|---|---|---|---|---|
| | | MAB to Base Substrate Bonding | Inter-MAB Bonding | Base Substrate-MAB Bonding | MAB to Base Substrate Bonding |
| Inherent adhesion only | Easiest | Reversible weak | Reversible very weak | Reversible weak | Reversible very weak |
| Application of PDMS mixture (10:1) | Easy | Irreversible moderate | Irreversible moderate | Irreversible moderate | Irreversible moderate |
| Application of PDMS Curing agent | Easy | Irreversible moderate | Irreversible strong | Irreversible moderate | Irreversible strong |
| Application of UV-curable adhesive component | Medium | Reversible strong | Reversible strong | Reversible strong | Reversible strong |
| Oxygen plasma Treatment | Difficult | Irreversible moderate | Irreversible very weak | Irreversible moderate | Irreversible very weak |

Depending on the adhesive component applied, the method can also comprise the step of reconfiguring the plurality of MABs 10 subsequent to the step of arranging the plurality of MABs 10 on the base substrate 14. Advantageously, this provides the ability to either change the design of the microfluidic device 12 or improve upon an existing microfluidic device 12.

One embodiment of the microfluidic device 12 can comprise the base substrate 14 having alignment posts 106. The alignment posts 106 help to ensure that slight deviations in the MAB 10 shape and thickness 44 do not cause an alignment problem with the MABs 10 arranged on the base substrate 14, especially when the microfluidic device 12 is relatively large. The alignment posts 106 constrain the MABs 10 in predefined areas on the base substrate 14. A certain number of the MABs 10 can be arranged on the base substrate 14 of this embodiment. Another such embodiment of the microfluidic device 12 comprises the base substrate 14 having cross-shaped alignment posts 106, as illustrated in FIGS. 9A-9C. The alignment posts 106 of this embodiment can improve MAB 10 alignment on the base substrate 14.

In yet another embodiment of the microfluidic device 12, a base substrate 14 having grid walls (not shown) defining a connection channel and MABs 10 having a roof (not shown) are employed. The base substrate 14 fixes the position of MABs 10 via the grid walls defining the connection channels for each MAB 10, in four directions. Although the resulting channeled base substrate 14 holds the MABs 10 in alignment, the interface area is doubled, since each MAB 10 will contact the grid walls rather than contact the adjacent MABs 10 directly. The roof structure on the MAB 10 acts as a cover to seal the connection channels of the substrate 14. This embodiment provides improved sealing. The MABs 10 having a roof cannot be assembled independently without the base substrate 14 having grid walls; users must always use the corresponding base substrate 14 having grid walls for assembly. Also the MABs 10 of this embodiment comprise multiple layers and, as such, require an MAB 10 fabrication process having multiple steps. To create the roofed MABs 10, three different photo masks may be needed; one for the channel 16 the other for the body parts of roofed MABs 10, and another for roof parts of the MABs 10. As such, variations in the Typically, operation of the microfluidic device 12 is controlled with a computer. One particular set up allows for the injection of fluids via air pressure. For instance, the MABs 10 defining the channel 16 in the inlet/outlet configuration 30 can be connected through syringes to a computer-controlled set-up, which includes sets of two-way solenoid valves. A suitable two-way solenoid valve is commercially produced by Numatech, Inc. of Wixom, Mich. Each solenoid valve can perform a pulsed air pressure injection or a pulsed vacuum suction. The switches to pressure and vacuum are programmed and operated by software systems such as LabView, commercially available through National Instruments of Austin, Tex. Liquid reagents and the like substances can be loaded via the syringes with aid of the computerized pressure control. The experiments may also be performed on the microfluidic device 12 oriented on a stage of a stereomicroscope. A suitable stereomicroscope is the Olympus SZX12 commercially produced Olympus of Center Valley, Pa. For evaporation tests, the inlets and outlets are sealed with glass slits such as those produced by Dow Corning of Midland, Mich.

In one specific example, a series of experiments were performed on the microfluidic device 12 comprising a plurality of the MABs 10 assembled on the base substrate 14. To exclude any effects of humidity and temperature, the microfluidic device 12 was kept at the same location throughout the experiments. During the experiments, which performed functions such as mixing and demonstrated the effectiveness of the MAB 10 defining the channel 16 and in the valve configuration 38, in situ imaging was recorded using a digital camera (Nikon Coolpix 4500) with a capture rate of 30 frames per second and then transferred to a computer for further analysis. A blue liquid comprising a 0.4% solution of Trypan blue (Sigma-Aldrich) and an orange liquid comprising fluorescein were used to characterize the mixing performance in the study. The luminance intensity images were recorded and transferred to the computer for evaluation. The RGB color images captured were converted into grayscale images. The grayscale images were further corrected from the background intensity. A computer program was written to analyze the luminance levels of the pixels along a perpendicular line drawn at the center across the channel 16 to verify that the microfluidic device 12 performed as designed.

In another specific example, a cell culture was performed on the microfluidic device 12, in this example, a green fluorescent protein, herein referred to as GFP, was prepared expressing *E. coli* cells induced by arabinose. The GFP was inserted into pET24a plasmid. The prepared bacteria cells were mixed with the culture media (Luria-Bertani, 20 g L-1) containing ampicillin and inserted into the microfluidic device 12 with a syringe. The microfluidic device 12 was then inserted into a reactor at 36° C. The fluorescent cell images recorded from the microscope (Olympus BX51) were moved to a computer for further analysis. In this example, MABs 10 having the rectangular shape 52 were used to construct a microfluidic device 12 for bacterial cell cultures, in which bacterial cell cultures were successfully performed. The microfluidic device 12 comprises a variety of MABs 10, including two MABs 10 defining the channel 16 in the inlet/outlet configuration 30 for sample/media injection and an MAB 10 defining the channel 16 in the culture bed configuration.

In yet another specific example, the addition of two fluidic streams in laminar flow results in a clean boundary between fluidic streams. The microfluidic device 12 comprising the MAB 10 having the channel 16 in the zigzag configuration 32 to generate molecular gradients is conceptualized in FIG. 11A. To show the working principles of this embodiment of the microfluidic device 12, a simple microfluidic device 12 that mixes blue dye and water into an outgoing stream is illustrated in FIG. 11B. The cross-sectional pattern in FIG. 11C shows a distinct gradient of blue dye concentrations at A-A'. For the device 12 in this example some of the MABs 10 utilized include, MABs 10 defining the channel 16 in the inlet/outlet configuration 30, MABs 10 defining the channel 16 in a cross configuration, and MABs 10 defining the channel 16 in a zigzag configuration 32.

Figure 12:
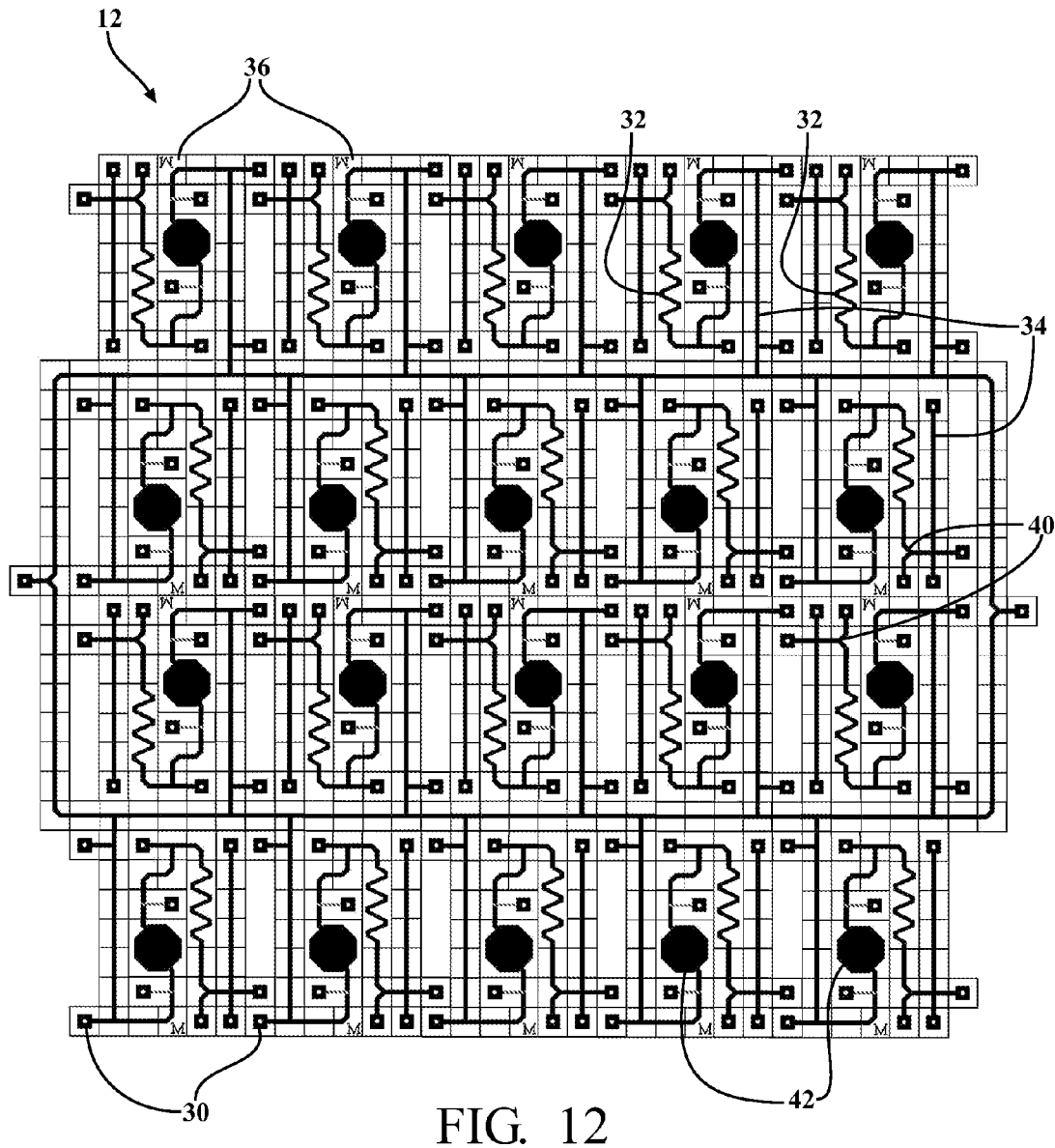
FIG. 12 is a schematic top view of another specific example of a microfluidic device that can perform twenty independent assays simultaneously from one sample.

The microfluidic device 12 can also perform complex biochemical assays. The conceptualized large-scale microfluidic device 12 is shown in FIG. 12. This embodiment of the microfluidic device 12 that can perform twenty independent assays in twenty assay units simultaneously from one sample. Each assay unit of the microfluidic device 12 can perform reagent mixing, polymerase chain reaction, restriction digest reaction, and separations.

The invention has been described in an illustrative manner, and it is to be appreciated that the terminology which is used is intended to be in the nature of words of description rather than of limitation. Obviously, many modifications and variations of the present invention are possible in view of the above teachings. It is, therefore, to be appreciated that within the scope of the claims the invention may be practiced otherwise than as specifically described, and that reference numerals are merely for convenience and are not to be in any way limiting.

What is claimed is:

1. A modular microfluidic system comprising:
a base substrate;
a plurality of microfluidic assembly blocks, each individual microfluidic assembly block defining a channel and having a sidewall defining an aperture into the channel, wherein said plurality of microfluidic assembly blocks comprise an interlocking mechanism for operatively connecting each of said plurality of microfluidic assembly blocks to each other, wherein said interlocking mechanism comprises a tab extending from said sidewall of one microfluidic assembly block and a recess defined by said sidewall of another microfluidic assembly block, wherein said channel is further defined by said tab, and wherein said tab has a convex surface having a radius and defines the aperture into the channel of the microfluidic assembly block, and the recess defines a concave surface having a radius and with the aperture into the channel of the other microfluidic block defined thereon; and
an adhesive component for bonding said plurality of microfluidic assembly blocks to one another and to said base substrate;
wherein when said plurality of microfluidic assembly blocks is arranged on said base substrate, the aperture into the channel of one microfluidic assembly block aligns with the aperture of another microfluidic assembly block with the channels thereof connected along a plane parallel to said base substrate thereby forming a channel network defined by said plurality of microfluidic assembly blocks.

2. A modular microfluidic system as set forth in claim 1 wherein said base substrate further defines the channel network.

3. A modular microfluidic system as set forth in claim 1 wherein said radius of said convex surface is smaller than said radius of said concave surface such that when said microfluidic assembly blocks are interlocked said convex surface and said concave surface create mechanical stress between said tab and the recess thereby sealing said channels.

4. A modular microfluidic system as set forth in claim 1 wherein said base substrate comprises a siloxane coating.

5. A modular microfluidic system as set forth in claim 1 wherein said base substrate is planar.

6. A modular microfluidic system as set forth in claim 1 wherein said base substrate has a plurality of alignment posts.

7. A modular microfluidic system as set forth in claim 1 wherein said microfluidic assembly blocks are individually coated with said adhesive component.

8. A modular microfluidic system as set forth in claim 1 wherein said adhesive component comprises a siloxane.

9. A method of assembling a modular microfluidic device, said method comprising the steps of:
providing a base substrate;
providing a plurality of microfluidic assembly blocks, each individual microfluidic assembly block defining a channel and having a sidewall defining an aperture into the channel, wherein the plurality of microfluidic assembly blocks comprises an interlocking mechanism, wherein said interlocking mechanism comprises a tab extending from said sidewall of one microfluidic assembly block and a recess defined by said sidewall of another microfluidic assembly block, wherein said channel is further defined by said tab, and wherein said tab has a convex surface having a radius and defines the aperture into the channel of the microfluidic assembly block, and the recess defines a concave surface having a radius and with the aperture into the channel of the other microfluidic block defined thereon;
arranging the plurality of microfluidic assembly blocks on the base substrate with the aperture into the channel of one microfluidic assembly block aligned with the aperture of another microfluidic assembly block and with the channels connected along a plane parallel to the base substrate thereby forming a channel network defined by the plurality of microfluidic assembly blocks; and
operatively connecting each of the plurality of microfluidic assembly blocks to each other via the interlocking mechanism.

10. A method as set forth in claim 9 further comprising the step of applying an adhesive component to the plurality of microfluidic assembly blocks.

11. A method as set forth in claim 10 wherein the adhesive component is applied prior to the step of arranging the plurality of microfluidic assembly blocks on the base substrate.

12. A method as set forth in claim 10 further comprising the step of curing the adhesive component via application of at least one of heat, infrared radiation, or ultraviolet radiation.

13. A method as set forth in claim 9 further comprising the step of reconfiguring the plurality of microfluidic assembly blocks subsequent to the step of arranging the plurality of microfluidic assembly blocks on the base substrate.

14. A method as set forth in claim 9 further comprising the step of applying a siloxane coating to the base substrate.

15. A microfluidic assembly block for a modular microfluidic assembly, said microfluidic assembly block defining a channel and having a sidewall defining an aperture formed by the channel, said microfluidic assembly block further comprising an interlocking mechanism for operatively connecting said microfluidic assembly block to an other microfluidic assembly block, wherein the interlocking mechanism comprises a tab extending from the sidewall of the microfluidic assembly block, wherein the channel is further defined by the tab, and wherein the tab has a convex surface having a radius and defines the aperture into the channel of the microfluidic assembly block, the tab configured to be received in a recess having a concave surface defined in the other microfluidic assembly block, and wherein when a plurality of microfluidic assembly blocks are arranged on a base substrate, the aperture into the channel of one microfluidic assembly block aligns with the aperture of another microfluidic assembly block with the channels thereof connected along a plane parallel to said base substrate thereby forming a channel network defined by said plurality of microfluidic assembly blocks.

\* \* \* \* \*